United States Patent
Nagano

(10) Patent No.: US 9,639,061 B2
(45) Date of Patent: May 2, 2017

(54) SOLAR CELL MODULE, TIMEPIECE, AND ELECTRONIC DEVICE

(71) Applicant: SEIKO EPSON CORPORATION, Tokyo (JP)

(72) Inventor: Daisuke Nagano, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/818,941

(22) Filed: Aug. 5, 2015

(65) Prior Publication Data
US 2016/0062317 A1    Mar. 3, 2016

(30) Foreign Application Priority Data
Aug. 28, 2014    (JP) .................................. 2014-173631

(51) Int. Cl.
| G04C 10/00 | (2006.01) |
| G04C 10/02 | (2006.01) |
| H01L 31/02 | (2006.01) |
| H01L 31/0352 | (2006.01) |
| H01L 31/0465 | (2014.01) |

(52) U.S. Cl.
CPC .......... G04C 10/02 (2013.01); H01L 31/0201 (2013.01); H01L 31/0352 (2013.01); H01L 31/0465 (2014.12); *Y02E 10/50* (2013.01)

(58) Field of Classification Search
CPC .... G04C 10/02; G04G 21/04; H01L 31/0201; H01L 31/0352; H01L 31/0465; Y02E 10/50
See application file for complete search history.

(56) References Cited

U.S. PATENT DOCUMENTS

| 4,038,104 A * | 7/1977 | Tsutomu ................ G04C 10/02 136/244 |
| 4,131,755 A * | 12/1978 | Keeling .............. H01L 31/0508 136/244 |
| 5,782,995 A * | 7/1998 | Nanya ............... H01L 31/02167 136/256 |
| 6,372,977 B1 * | 4/2002 | Miyoshi ................ G04C 10/02 136/246 |
| 6,542,455 B1 * | 4/2003 | Kuwahara .............. G11B 7/131 257/E31.038 |
| 9,134,706 B2 * | 9/2015 | Saito ....................... G04C 10/02 |
| 2002/0029798 A1 * | 3/2002 | Miyoshi ................ G04C 10/02 136/244 |

(Continued)

FOREIGN PATENT DOCUMENTS

| JP | 2001284618 A | 10/2001 |
| JP | 2009122126 A | 6/2009 |

(Continued)

*Primary Examiner* — Sean Kayes
(74) *Attorney, Agent, or Firm* — Oliff PLC

(57) ABSTRACT

A solar cell module includes a solar cell panel configured to have multiple pieces and a substrate that connects the multiple pieces to each other. The multiple pieces include a first piece and a second piece adjacent to the first piece. Opposing sides of the first piece and the second piece respectively have a mutually fittable shape. A length of the mutually fittable shape is longer than a distance of a straight line which connects both ends of the mutually fittable shape.

22 Claims, 14 Drawing Sheets

(56) References Cited

U.S. PATENT DOCUMENTS

| | | | |
|---|---|---|---|
| 2011/0051561 A1* | 3/2011 | Fujisawa | G04G 5/002 368/47 |
| 2012/0105288 A1* | 5/2012 | Abe | G04C 10/02 343/702 |
| 2014/0060614 A1* | 3/2014 | Saito | H01L 31/0465 136/244 |
| 2014/0144479 A1* | 5/2014 | Kim | H01L 31/0463 136/244 |
| 2014/0247705 A1* | 9/2014 | Saito | G04C 10/02 368/205 |

FOREIGN PATENT DOCUMENTS

| | | |
|---|---|---|
| JP | 2012108043 A | 6/2012 |
| JP | 2012185141 A | 9/2012 |
| JP | 2015-060907 A | 3/2015 |

* cited by examiner

SOLAR CELL MODULE, TIMEPIECE, AND ELECTRONIC DEVICE

BACKGROUND

1. Technical Field

This application claims a priority to Japanese Patent Application No. 2014-173631 filed on Aug. 28, 2014 which is hereby expressly incorporated by reference in its entirety.

Several aspects of the present invention relate to a solar cell module, a timepiece, and an electronic device.

2. Related Art

Since periodic replacement of batteries is no longer required, a solar timepiece including a solar cell has been widely used. JP-A-2001-284618 discloses the solar timepiece including the solar cell. According to the disclosure, in order to secure a sufficient voltage, the solar timepiece includes a support substrate and the solar cell having multiple solar cell elements formed on a surface of the support substrate. The multiple solar cell elements are serially connected to each other, thereby increasing a solar cell power generation voltage used for the solar timepiece. The support substrate is a glass plate. A lower electrode layer, a power generation layer, and an upper electrode layer are formed on the glass plate.

The support substrate disclosed in JP-A-2001-284618 is the glass plate. The glass plate is a material which is less likely to be processed thinly. A thin and light electronic device such as a wrist watch is easy to use. If the support substrate is thinner, it is possible to achieve the thinner and lighter electronic device such as the wrist watch. Therefore, when the thinner solar cell is needed, a structure is conceivable which forms the support substrate using a metal plate and uses the support substrate as a lower electrode.

With regard to this structure, a method of serially joining the multiple solar cell elements as described above includes a method of cutting a single solar cell panel so as to be divided into the multiple solar cell elements. The solar cell panel employs a type in which a conductive support layer and a transparent conductive film stacked thereon via a power generation film are respectively used as electrodes. In this case, the solar cell panel is cut on the support substrate, and is divided into multiple pieces (solar cell panels). However, when the solar cell panel is divided into multiple pieces in this way, the respective pieces have to be assembled to the electronic device such as the wrist watch, thereby causing poor productivity.

Therefore, a method is conceivable in which the respective pieces are bonded to a thin substrate and the substrate having the respective pieces bonded thereto is assembled to the electronic device such as the wrist watch. However, when the substrate is thin, the rigidity of the substrate decreases, and the substrate having the respective pieces bonded thereto is bent, thereby causing a problem of difficult assembly. For this reason, there has been a demand for a solar cell module in which the substrate having the respective pieces bonded thereto is likely to be assembled even when the substrate itself is likely to be bent.

SUMMARY

An advantage of some aspects of the invention is to solve the problems described above, and the invention can be implemented as the following forms or application examples.

Application Example 1

This application example is directed to a solar cell module including a solar cell panel that is configured to include multiple pieces, and a substrate that connects the multiple pieces to each other. The multiple pieces include a first piece and a second piece which is adjacent to the first piece. Opposing sides of the first piece and the second piece respectively have a mutually fittable shape. A length of the mutually fittable shape is longer than a distance of a straight line which connects both ends of the mutually fittable shape.

According to this application, the solar cell panel is configured to include the multiple pieces, and the pieces are connected to each other by the substrate. The first piece and the second piece are adjacent to each other. The respective sides on which the first piece and the second piece oppose each other have the mutually fittable shape. The length of the mutually fittable shape is longer than the distance of the straight line which connects both ends of the mutually fittable shape. Therefore, the mutually fittable shape is not the straight line, and has an uneven shape. Accordingly, the substrate which connects the respective pieces is prevented from being folded along a fold line of the straight line, and thus the solar cell panel is less likely to be folded. Therefore, the pieces are prevented from being misaligned with each other due to the folded substrate. The solar cell module has the solar cell panel including the multiple pieces, and maintains a flat state. As a result, it is possible to provide the solar cell module in which the substrate to which the respective pieces are bonded is easily assembled thereto, even when the substrate itself is likely to be bent.

Application Example 2

This application example is directed to the solar cell module according to the application example described above, wherein in a state where the solar cell panel is planarly viewed, at least a portion of the mutually fitted shape does not overlap a straight line which connects both ends of the mutually fittable shape.

According to this application example, at least a portion of the mutually fittable shape does not overlap the straight line which connects both ends of the mutually fittable shape. The portion which is not overlapped can prevent the solar cell module from being folded along a fold line of the straight line which connects both ends of the mutually fittable shape. As a result, it is possible to provide the solar cell module in which the substrate to which the respective pieces are bonded is easily assembled thereto, even when the substrate itself is likely to be bent.

Application Example 3

This application example is directed to the solar cell module according to the application example described above, wherein in a state where the solar cell module is planarly viewed from a solar cell panel side, if an area belonging to the solar cell panel is compared with an area belonging to the substrate, the area belonging to the solar cell panel is wider.

According to this application example, when the solar cell module is planarly viewed from the solar cell panel side, the area belonging to the substrate is wider than the area belonging to the solar cell panel. When light is emitted to the solar cell module, light emitted to the solar cell panel contributes to power generation, and light emitted to the substrate does not contribute to power generation. The area of the solar cell panel which contributes to the power generation is wider than the area of the substrate which does not contribute to the power generation. Accordingly, the solar cell module can efficiently generate power.

Application Example 4

This application example is directed to the solar cell module according to the application example described above, wherein at least one of the solar cell panel and the substrate has a through-hole, and a surface height of a region located within a predetermined distance from the through-hole in each of the multiple pieces is uniform.

According to this application example, at least any one of the solar cell panel and the substrate has the through-hole. The surface height of the region located within the predetermined distance from the through-hole is uniform. Therefore, a structure installed in the through-hole can utilize space on the region located within the predetermined distance from the through-hole.

Application Example 5

This application example is directed to the solar cell module according to the application example described above, wherein the through-hole is disposed in the substrate.

According to this application example, the through-hole is disposed in the substrate. As compared to the substrate, the solar cell panel is manufactured through more work processes. In this case, the solar cell panel can be more easily manufactured when the through-hole is absent than when the through-hole is present. Therefore, it is possible to manufacture the solar cell panel by installing the through-hole in the substrate.

Application Example 6

This application example is directed to the solar cell module according to the application example described above, wherein each of the multiple pieces has a conductive support substrate, a power generation layer which generates power by receiving light, and a transparent conductive film layer which is formed on the power generation layer.

According to this application example, the solar cell module includes the power generation layer which generates the power by receiving the light. Furthermore, the solar cell module includes conductive support substrate and the transparent conductive film layer which is formed on the power generation layer. Therefore, the power generated by the power generation layer can be output from the support substrate and the transparent conductive film layer.

Application Example 7

This application example is directed to the solar cell module according to the application example described above, wherein the respective multiple pieces are serially connected to each other.

According to this application example, the respective multiple pieces are serially connected to each other. Therefore, the solar cell module can output a voltage to which a voltage generated by each piece is added.

Application Example 8

This application example is directed to the solar cell module according to the application example described above, wherein respective power generation-available areas of the multiple pieces are the same as each other.

According to this application example, the respective multiple pieces are serially connected to each other, and the respective power-generation-available areas are the same as each other. In this case, the multiple pieces of the solar cell panel can output the same amount of current. When the respective power-generation-available areas of the respective pieces of the solar cell panel are different from each other, a current output from the piece whose power generation-available area is narrowest is output from the solar cell module. As compared to this case, the solar cell module can more efficiently output the current.

Application Example 9

This application example is directed to a timepiece that includes a dial and the solar cell module according to any one of the application examples described above.

According to this application example, the timepiece includes the dial and the solar cell module. The solar cell module is a module which is easily assembled to the timepiece while maintaining a flat state. Therefore, the timepiece according to this application example functions as a timepiece including the solar cell module which is easily assembled to the timepiece.

Application Example 10

This application example is directed to the timepiece according to the application example described above, wherein in a state of being viewed from the solar cell panel side, an area of the solar cell module is equal to or smaller than an area of the dial.

According to this application example, the area of the solar cell module is equal to or smaller than the area of the dial. Therefore, a lot of the timepieces according to this application example can be manufactured using a raw plate material since the solar cell module is small. Therefore, it is possible to provide the timepiece including the solar cell module which is very productively manufactured.

Application Example 11

This application example is directed to the timepiece according to the application example described above, which includes the solar cell module described above, and the through-hole is provided in order to install a hand of the timepiece.

According to this application example, the timepiece includes the through-hole. The through-hole is used in order to install the hand of the timepiece. Therefore, it is also possible to install the hand for the timepiece having the solar cell module installed therein.

Application Example 12

This application example is directed to an electronic device that includes the solar cell module described above.

According to this application example, the electronic device includes the solar cell module. The solar cell module is a module which is easily assembled to the electronic device while maintaining a flat state. Therefore, the electronic device according to this application example can be an electronic device including the solar cell module which is easily assembled to the electronic device.

BRIEF DESCRIPTION OF THE DRAWINGS

The invention will be described with reference to the accompanying drawings, wherein like numbers reference like elements.

DESCRIPTION OF EXEMPLARY EMBODIMENTS

In the present embodiment, a manufacturing method of a timepiece having a solar cell installed therein and the solar cell will be described with reference to the drawings. Each member in each drawing is illustrated at different scales so that each member has a recognizable size in each drawing.

First Embodiment

Figure 1:
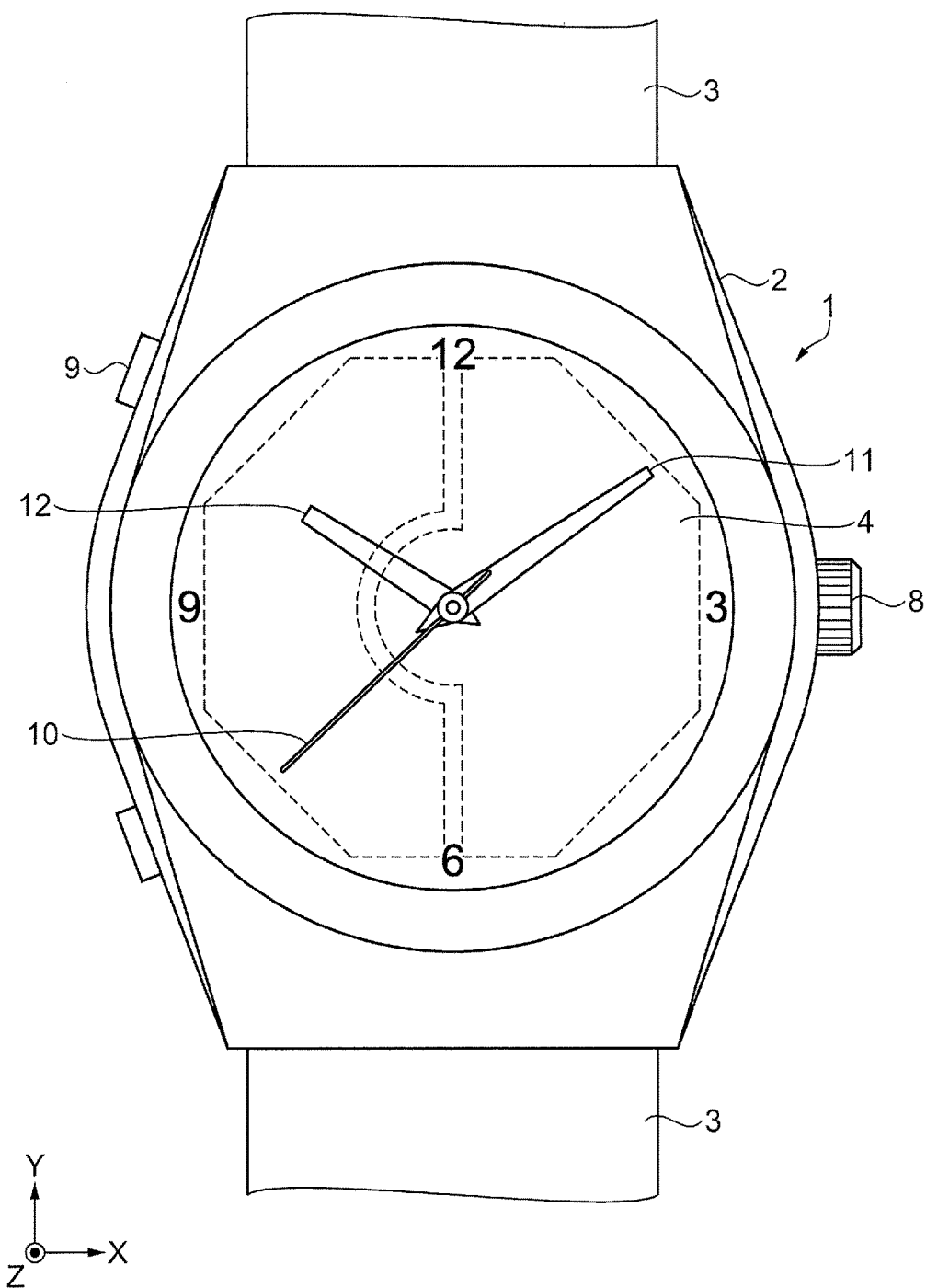
FIG. 1 is a schematic plan view illustrating a structure of a timepiece according to a first embodiment.
Figure 2:
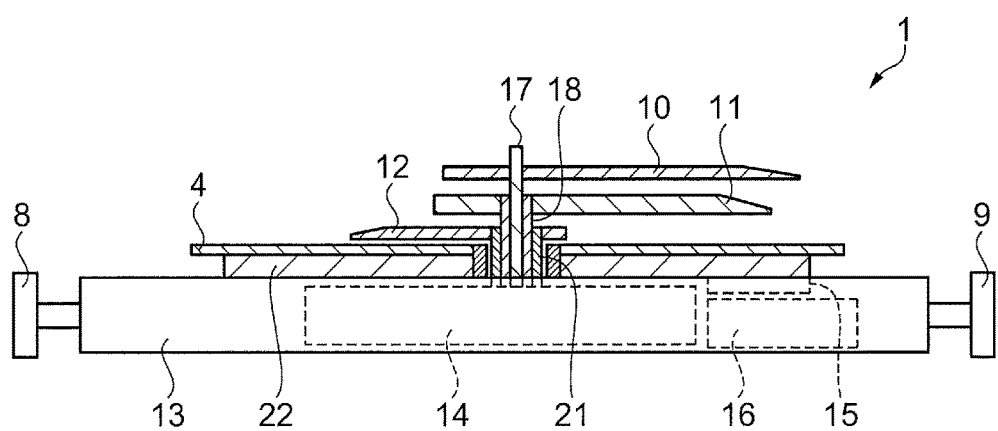
FIG. 2 is a schematic side sectional view illustrating the structure of the timepiece.

A timepiece and a solar cell according to a first embodiment will be described with reference to FIGS. 1 to 9B. First, the timepiece having a solar cell module installed therein will be described. FIG. 1 is a schematic plan view illustrating a structure of the timepiece. FIG. 2 is a schematic side sectional view illustrating the structure of the timepiece.

As illustrated in FIG. 1, a timepiece 1 serving as an electronic device includes a timepiece case 2, and a pair of bands 3 is connected to the timepiece case 2. The timepiece case 2 is formed of a metal material such as stainless steel or a resin material such as plastic resin. In the drawing, an extending direction of the band 3 is referred to as a direction Y, and a direction orthogonal to the direction Y is referred to as a direction X. A thickness direction of the timepiece case 2 is referred to as a direction Z. A dial 4 is installed in a direction +Z side of the timepiece case 2. A transparent cover (not illustrated) made of glass or resin is press-fitted and fixed to the timepiece case 2 via a press-fitting ring (not illustrated) made of resin or metal.

The dial 4 is installed so as to oppose the transparent cover. The dial 4 is a flat plate which displays characters indicating the time. For example, the dial 4 according to the embodiment displays the time of 12 o'clock, 3 o'clock, 6 o'clock, and 9 o'clock. The dial 4 has a light-transmitting property. A secondhand 10, a minute hand 11, and an hour hand 12 are installed between the dial 4 and the transparent cover. The second hand 10, the minute hand 11, and the hour hand 12 rotate around the center of the dial 4 serving as the rotation center.

A crown 8 serving as a manipulator is installed on a side surface in the direction +X side of the timepiece case 2. Two operation buttons 9 are disposed on a side surface in the direction −X side of the timepiece case 2. The crown 8 can be pushed and pulled in multiple stages. The second hand 10, the minute hand 11, and the hour hand 12 are rotated by rotating the crown 8, thereby enabling position adjustment.

As illustrated in FIG. 2, the timepiece 1 includes a movement 13. A train wheel 14, a drive circuit 15, and a power source unit 16 are installed in the movement 13. The movement 13 represents a section excluding an exterior and hands in the timepiece 1. The train wheel 14 is configured to include multiple wheels, and each wheel rotates at different rotation speed. A second hand axle 17, a minute hand axle 18, and an hour hand axle 21 protrude from the train wheel 14. The second hand 10 is installed in the second hand axle 17, the minute hand 11 is installed in the minute hand axle 18, and the hour hand 12 is installed in the hour hand axle 21.

A solar cell module 22 and the dial 4 are overlapped and installed on the movement 13 on the hour hand 12 side of the movement 13. Scales indicating the hour, minute, and second are installed in the dial 4. The dial 4 is configured to include a light-transmitting material. Light emitted to the timepiece 1 is emitted to the solar cell module 22. The solar cell module 22 receives the light, and generates power. The solar cell module 22 is connected to the drive circuit 15 by a wire (not illustrated).

The power generated by the solar cell module 22 passes through the drive circuit 15, and is supplied to the power source unit 16. The power source unit 16 includes a capacitor, and the power source unit 16 stores the power generated by the solar cell module 22. A motor (not illustrated) is installed in the drive circuit 15, and the drive circuit 15 drives the motor. In this case, the drive circuit 15 uses the power stored in the power source unit 16. The wheels inside the train wheel 14 are rotated by the motor, thereby rotating the second hand axle 17, the minute hand axle 18, and the hour hand axle 21. As a result, the second hand 10, the minute hand 11, and the hour hand 12 are rotated.

When planarly viewed from the solar cell module 22 side, an area of the solar cell module 22 is equal to or smaller than that of the dial 4. In the drawing, the solar cell module 22 is smaller than the dial 4. However, the solar cell module 22 may have the same area as the dial 4.

Figure 3:
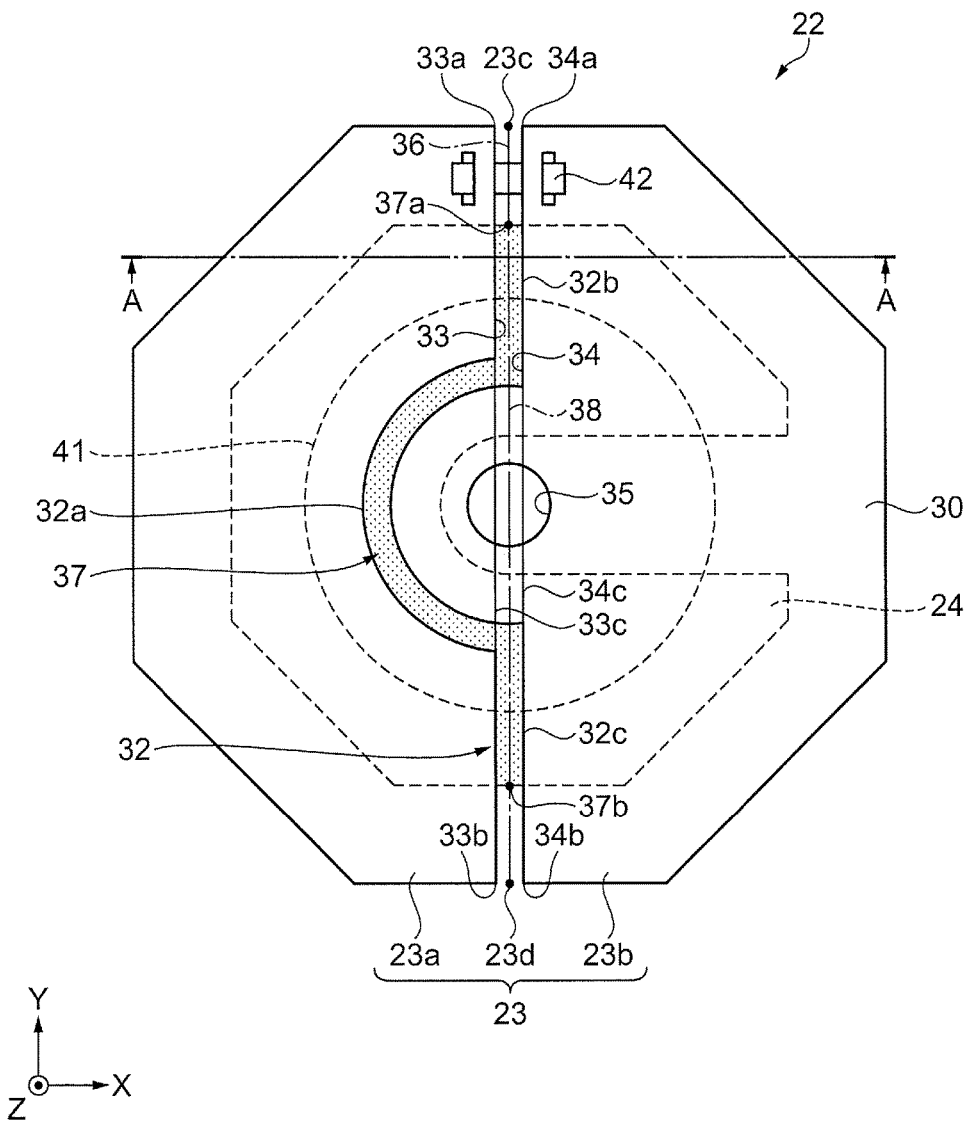
FIG. 3 is a schematic plan view illustrating a structure of a solar cell module.
Figure 4:
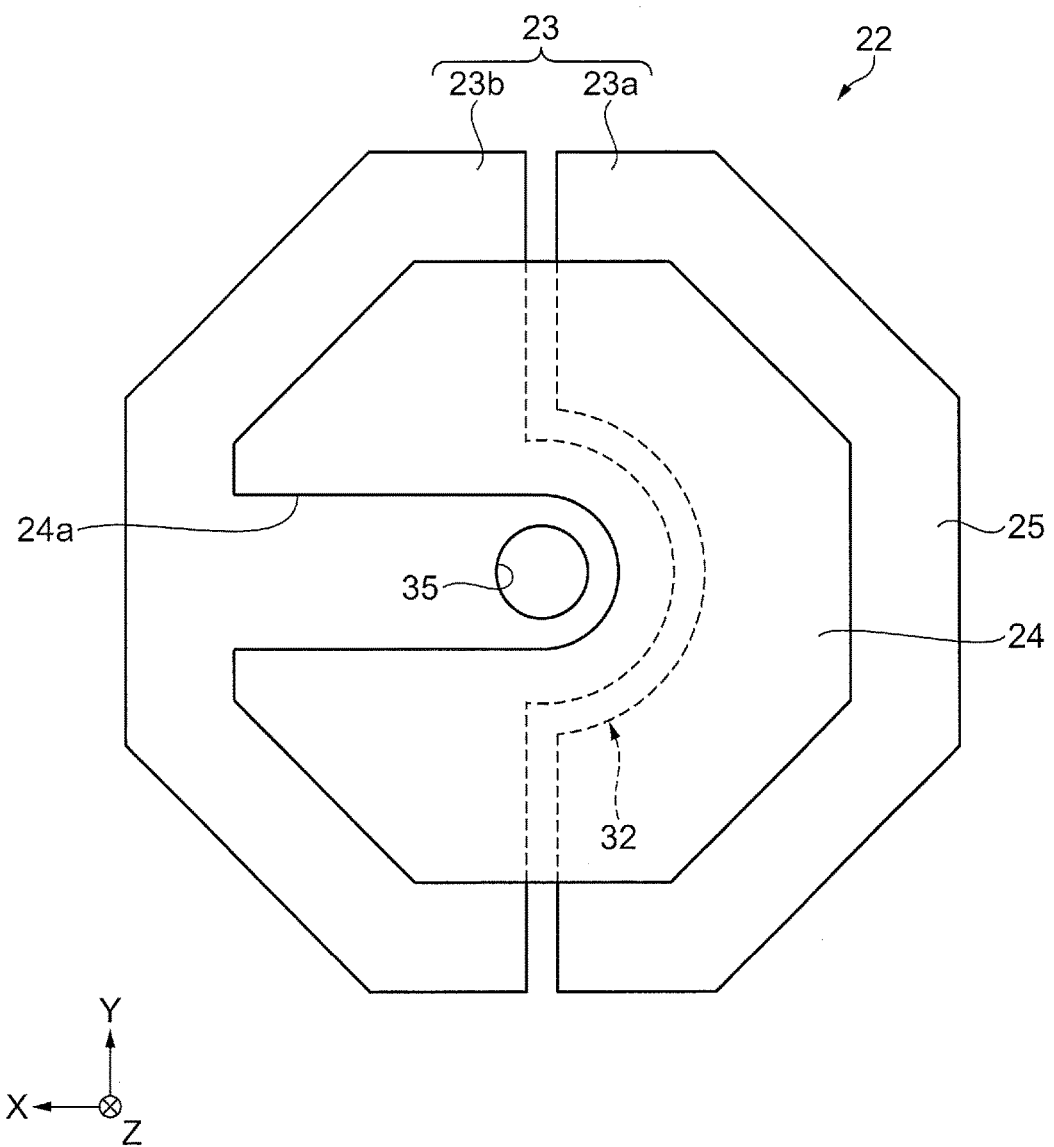
FIG. 4 is a schematic bottom view illustrating the structure of the solar cell module.
Figure 5:
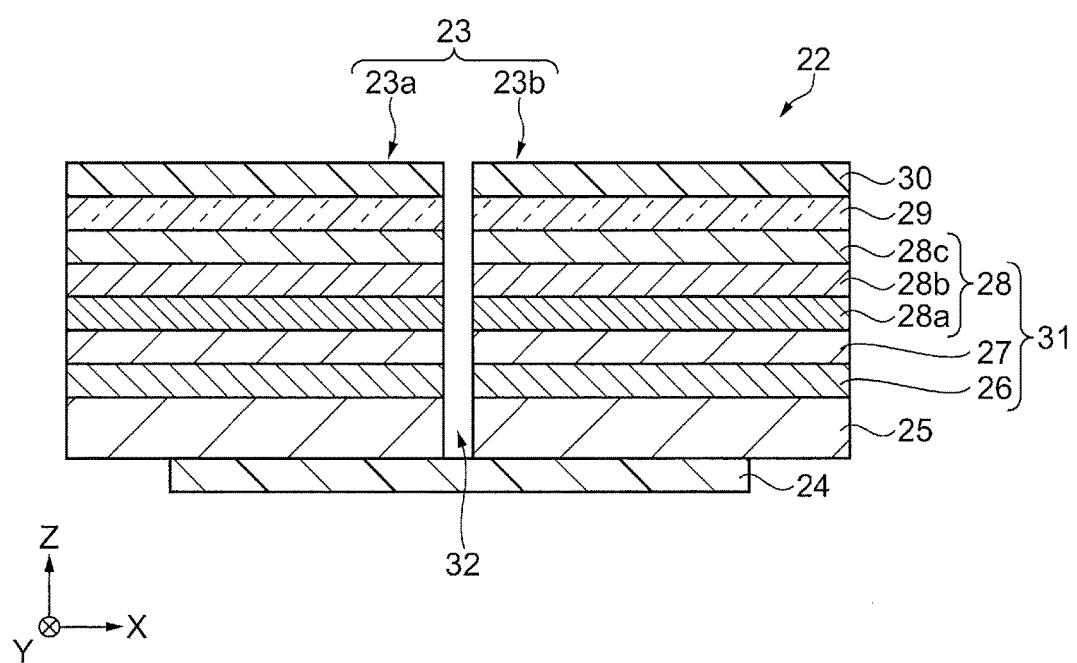
FIG. 5 is a schematic sectional view illustrating the structure of the solar cell module.

Next, the solar cell module will be described. FIG. 3 is a schematic plan view illustrating a structure of the solar cell module. FIG. 4 is a schematic bottom view illustrating the structure of the solar cell module. FIG. 5 is a schematic sectional view illustrating the structure of the solar cell module, and is a view taken along line A-A in FIG. 3.

As illustrated in FIGS. 3 to 5, the solar cell module 22 includes a solar cell panel 23 and a substrate 24. The solar cell panel 23 is a stacked panel which generates power by receiving sunlight. The solar cell panel 23 has a substantially regular octagonal shape when planarly viewed in the direction Z. Bending elasticity of the solar cell panel 23 is greater than bending elasticity of the substrate 24. The substrate 24 is a flexible substrate.

The solar cell panel 23 is configured so that a support substrate 25, an aluminum layer 26, a zinc oxide layer 27, a power generation layer 28, a transparent conductive film layer 29, and a protective film layer 30 are stacked on one another in this order. Light is incident on the solar cell panel 23 from the protective film layer 30 side.

The support substrate 25 is a conductive substrate, and may be formed using a metal plate. For example, in the embodiment, a stainless steel plate is used for the support substrate 25. The support substrate 25 functions as an electrode, and functions as an anode in the embodiment. The aluminum layer 26 has an uneven shape formed on a surface of the support substrate 25. The aluminum layer 26 is a layer which scatters and reflects light transmitted through the power generation layer 28, within sunlight incident on the solar cell panel 23 from the protective film layer 30 side. The zinc oxide layer 27 is a layer which adjusts a refractive index of the light between the power generation layer 28 and the aluminum layer 26. The aluminum layer 26 and the zinc oxide layer 27 enable the solar cell panel 23 to have improved light utilization efficiency.

The power generation layer 28 is a layer which receives the light and generates power. For example, in the embodiment, the power generation layer 28 has triple layer structure (triple junction structure), and is a multi-junction-type power generation layer. The power generation layer 28 includes a first amorphous silicon germanium layer 28a (a-SiGe layer), a second amorphous silicon germanium layer 28b, and an amorphous silicon layer 28c (a-Si layer), sequentially from the zinc oxide layer 27 side.

The first amorphous silicon germanium layer 28a and the second amorphous silicon germanium layer 28b are made of amorphous silicon with doped germanium. Amounts of the germanium doped in the first amorphous silicon germanium layer 28a and the second amorphous silicon germanium layer 28b are different from each other. The first amorphous silicon germanium layer 28a, the second amorphous silicon germanium layer 28b, and the amorphous silicon layer 28c are set to have mutually different absorption wavelength regions. The aluminum layer 26, the zinc oxide layer 27, and the power generation layer 28 are collectively referred to as a solar cell body 31.

The transparent conductive film layer 29 functions as an electrode, and is a transparent conductive film layer which functions as a cathode in the embodiment. The transparent conductive film layer 29 is light-transmitting and conductive film. Types of the transparent conductive film layer 29 are not particularly limited. For example, it is possible to use indium-gallium oxide (IGO), indium tin oxide (ITO), and indium-cerium oxide (ICO). For example, the embodiment employs the ITO as the transparent conductive film layer 29.

The protective film layer 30 is a layer which protects the transparent conductive film layer 29. The protective film layer 30 has an insulating property and a light-transmitting property. Types of the protective film layer 30 are not particularly limited. For example, it is possible to use a resin film made of acrylic resin.

The solar cell panel 23 has a conductive support substrate 25, the power generation layer 28 which generates power by receiving light, and the transparent conductive film layer 29 which is formed on the power generation layer 28. Accordingly, the power generated by the power generation layer 28 can be output from the support substrate 25 and the transparent conductive film layer 29.

The solar cell panel 23 is configured to include a first piece 23a serving as the first piece and a second piece 23b serving as the second piece. In other words, the solar cell panel 23 is configured to include multiple pieces. A linear gap 32 is installed between the first piece 23a and the second piece 23b. The first piece 23a and the second piece 23b are adjacent to each other while interposing the gap 32 therebetween.

A side on the gap 32 side in the first piece 23a is referred to as a first side 33. A side on the gap 32 side in the second piece 23b is referred to as a second side 34. The first side 33 and the second side 34 oppose each other. The first side 33 and the second side 34 have a mutually fittable shape. An end of the first side 33 in the direction +Y side is referred to as a first side upper end 33a, and an end of the first side 33 in the direction −Y side is referred to as a first side lower end 33b. A length of a shape extending along the first side 33 is longer than a distance of a straight line which connects the first side upper end 33a and the first side lower end 33b. Similarly, an end of the second side 34 in the direction +Y side is referred to as a second side upper end 34a, and an end of the second side 34 in the direction −Y side is referred to as a second side lower end 34b. A length of a shape extending along the second side 34 is longer than a distance of a straight line which connects the second side upper end 34a and the second side lower end 34b.

When the solar cell panel 23 is planarly viewed in the direction Z, a portion of the first side 33 does not overlap a straight line 33c which connects the first side upper end 33a and the first side lower end 33b. In addition, a portion of the second side 34 does not overlap a straight line 34c which connects the second side upper end 34a and the second side lower end 34b. The portions which are not overlapped can prevent the solar cell module 22 from being folded along a fold line of the straight line 33c or the straight line 34c.

A shape of the first side 33 and the second side 34 is not a straight line, and is an uneven shape. Accordingly, the substrate 24 which connects the first piece 23a and the second piece 23b is prevented from being folded along a fold line of the straight line, and thus the solar cell panel 23 is less likely to be folded. Therefore, the pieces are prevented from being misaligned with each other due to the folded substrate 24. As a result, the solar cell module 22 has the solar cell panel 23 including the multiple pieces, and maintains a flat state. Therefore, it is possible to provide a module which is easily assembled to the movement 13.

The solar cell panel 23 has a through-hole 35 installed at a location which functions as the center of gravity. The through-hole 35 is a hole for installing the hour hand axle 21, and is installed in the second piece 23b.

The gap 32 is formed so as to connect two points of an outer shape of the solar cell panel 23, that is, a first outer shape point 23c and a second outer shape point 23d. The gap 32 includes an arcuate portion 32a, a first straight line portion 32b, and a second straight line portion 32c. When planarly viewed in the direction Z, the arcuate portion 32a has a semicircular arcuate shape which is formed around the through-hole 35 and whose diameter is approximately one third of the diameter of the solar cell panel 23. The arcuate portion 32a is formed so as to protrude in the direction −X side of the timepiece 1.

The first straight line portion 32b and the second straight line portion 32c have a straight line shape extending in the direction Y. The first straight line portion 32b connects the first outer shape point 23c and an end point of the arcuate portion 32a in the direction +Y side. The second straight line portion 32c connects the second outer shape point 23d and an endpoint of the arcuate portion 32a in the direction −Y side. The gap 32 is longer than a line segment 36 which connects the first outer shape point 23c and the second outer shape point 23d. The gap 32 is formed so as not to pass through the through-hole 35.

The gap 32 is formed so as not to overlap at least a portion of the line segment 36. That is, in the embodiment, since the gap 32 includes the arcuate portion 32a, the gap 32 is formed so as not to overlap a central portion of the line segment 36. Therefore, the solar cell module 22 is prevented from being folded along a fold line of the line segment 36.

A region 37 is a region where the substrate 24 is exposed from the gap 32. Points on both end portions in the direction extending along the gap 32 in the region 37 are respectively referred to as an upper side end point 37a and a lower side end point 37b. In this case, the gap 32 is formed so that at least a portion of a line segment 38 which connects the upper side end portion 37a and the lower side end portion 37b does not overlap the gap 32. In the embodiment, the line segment 36 and the line segment 38 are located on the same line. Accordingly, similarly to the above-described case, the gap 32 does not overlap the central portion of the line segment 38.

A width of the gap 32 is 0.1 mm to 0.3 mm, for example. Since the width of the gap 32 is a value within this range, it is possible to more easily prevent the substrate 24 from being folded.

When planarly viewed in the direction Z side, an area obtained by adding the first piece 23a to the second piece 23b is wider than the exposed region 37 of the substrate 24. When light is emitted to the solar cell module 22, light emitted to the solar cell panel 23 contributes to power generation, but light emitted to the substrate 24 does not contribute to power generation. An area of the solar cell panel 23 which contributes to the power generation is wider than an area of the substrate 24 which does not contribute to the power generation. Accordingly, the solar cell module 22 can efficiently generate power.

In a region 41 which is away from the through-hole 35 at the equal distance, the solar cell module 22 has a uniform surface height. Therefore, the hour hand 12 installed via the hour hand axle 21 installed in the through-hole 35 can utilize space on the region 41.

The first piece 23a and the second piece 23b are serially connected to each other by a wiring member 42. Therefore, the solar cell module 22 can output a voltage to which a voltage generated by each piece is added. The power generation-available area of the first piece 23a and the power generation-available area of the second piece 23b are the same area. In this case, the first piece 23a and the second piece 23b can output the same amount of current. When the power generation-available areas of the first piece 23a and the second piece 23b are different from each other, a current output from the narrowest power generation-available area is output from the solar cell module 22. Compared to this case, the solar cell module 22 according to the embodiment can more efficiently output the current.

The substrate 24 is bonded onto the support substrate 25 so as to connect the first piece 23a and the second piece 23b. The substrate 24 has a shape in which a regular octagonal shape is partially cut out by a cut-out portion 24a when planarly viewed in the direction Z side.

The cut-out portion 24a is cut out in a band shape extending in the direction +X while the surroundings of the through-hole 35 have an arcuate shape. The cut-out portion 24a is formed so as to surround the through-hole 35. The substrate 24 is bonded thereto so as not to overlap the through-hole 35. In other words, the substrate 24 is bonded thereto so that the through-hole 35 is arranged inside the cut-out portion 24a. An electrode connection portion on the support substrate 25 side can be assigned to an exposed portion without being covered with the substrate 24.

An area of the substrate 24 is smaller than an area of the solar cell panel 23. In addition, bending elasticity of the substrate 24 is smaller than bending elasticity of the solar cell panel 23.

Figure 6:
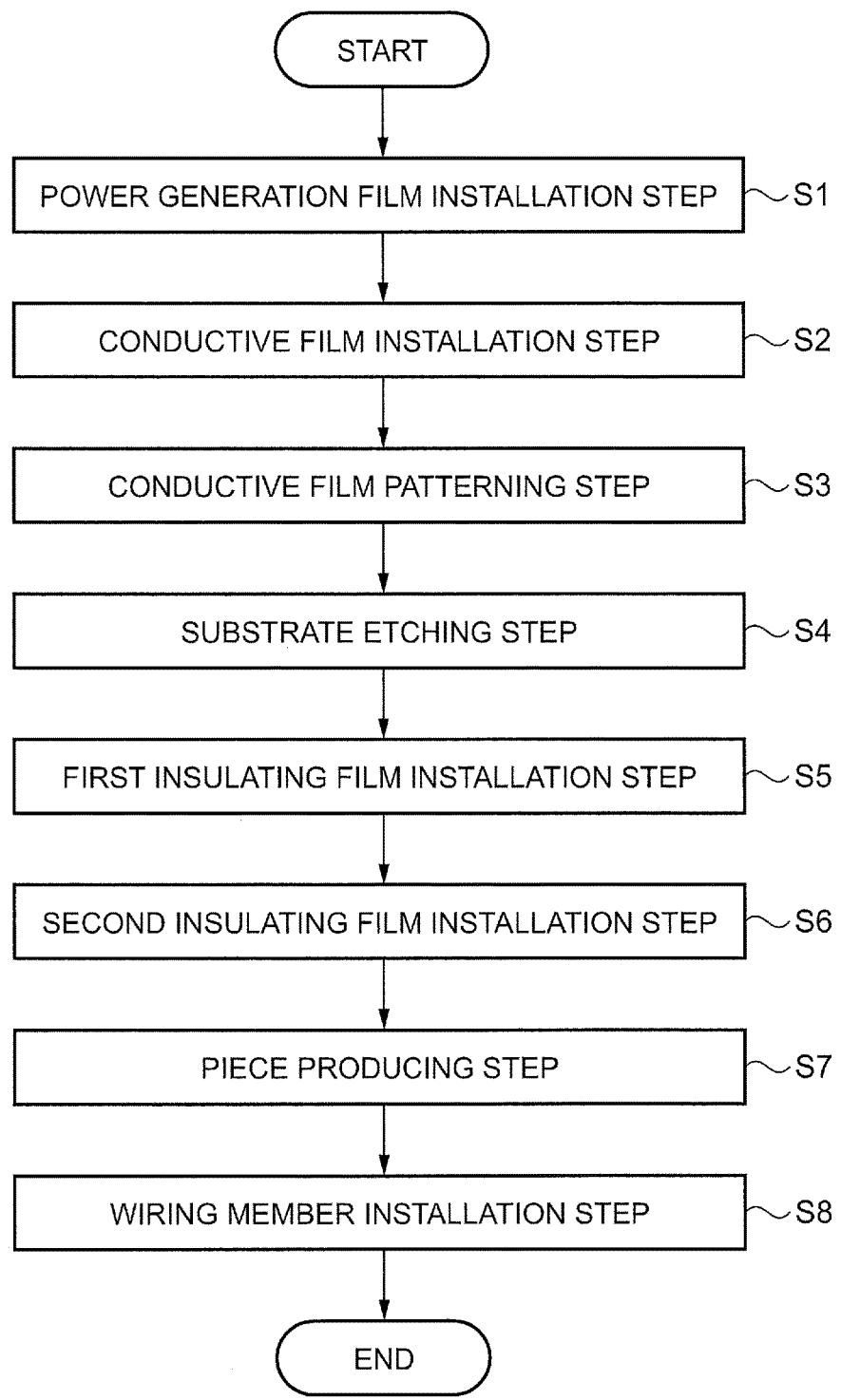
FIG. 6 is a flowchart of a manufacturing method of a solar cell.

Next, a manufacturing method of the above-described solar cell module 22 will be described with reference to FIGS. 6 to 9B. FIG. 6 is a flowchart of a manufacturing method of the solar cell. FIGS. 7A to 9B are schematic views for describing another manufacturing method of the solar cell. In the flowchart illustrated in FIG. 6, Step S1 represents a power generation film installation step. In this step, the power generation layer 28 is installed on the support substrate 25. Next, the process proceeds to Step S2. Step S2 represents a conductive film installation step. In this step, the transparent conductive film layer 29 is installed on the power generation layer 28. Next, the process proceeds to Step S3. Step S3 represents a conductive film patterning step. In this step, the transparent conductive film layer 29 is patterned into a predetermined shape. Next, the process proceeds to Step S4.

Step S4 represents a substrate etching step. In this step, the support substrate 25 is subjected to etching by using a resist film as a mask. Next, the process proceeds to Step S5. Step S5 represents a first insulating film installation step. In this step, the protective film layer 30 is installed on the transparent conductive film layer 29. Next, the process proceeds to Step S6. Step S6 represents a second insulating film installation step. In this step, the substrate 24 is installed on the support substrate 25. Next, the process proceeds to Step S7. Step S7 represents a piece producing step. In this step, the support substrate 25 is divided into pieces. Next, the process proceeds to Step S8. Step S8 represents a wiring member installation step. In this step, the wiring member 42 is installed in the solar cell panel 23. Through the above-described steps, the manufacturing steps of the solar cell module 22 are completed.

Next, corresponding to the steps illustrated in FIG. 6, the manufacturing method will be described in detail with reference to FIGS. 7A to 9B.

Figure 7A:
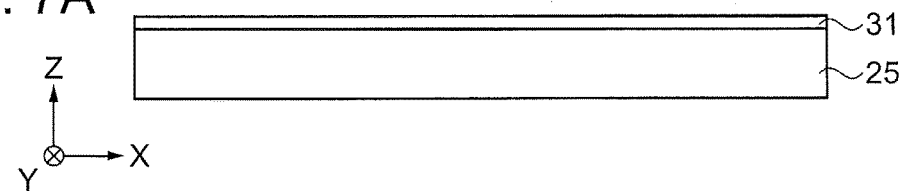
FIGS. 7A to 7E are schematic views for describing the manufacturing method of the solar cell.

FIG. 7A is a view corresponding to the power generation film installation step in Step S1. As illustrated in FIG. 7A, the solar cell body 31 is installed on the support substrate 25. First, the aluminum layer 26 is formed on the support substrate 25 by using aluminum. An uneven shape is formed on a surface of the aluminum layer 26 by adjusting film forming conditions. Next, the zinc oxide layer 27 is formed on the aluminum layer 26.

Next, the first amorphous silicon germanium layer 28a having doped germanium is formed on the zinc oxide layer 27. Furthermore, the second amorphous silicon germanium layer 28b having doped germanium is formed on the first amorphous silicon germanium layer 28a. When the second amorphous silicon germanium layer 28b is formed, an amount of the doped germanium is decreased as compared to the first amorphous silicon germanium layer 28a.

Next, the amorphous silicon film is formed on the second amorphous silicon germanium layer 28b so as to form the amorphous silicon layer 28c. In the above-described manner, the power generation layer 28 is formed. Films of each layer can be manufactured by using a chemical vapor deposition method or a physical vapor deposition method such as an evaporation method and a sputtering method.

Figure 7B:
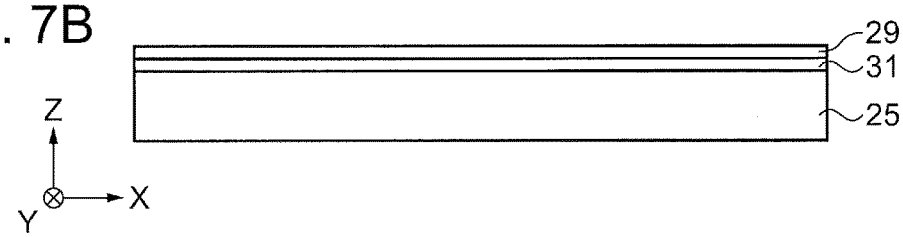

FIG. 7B is a view corresponding to the conductive film installation step in Step 2. As illustrated in FIG. 7B, in Step S2, the transparent conductive film layer 29 is formed on the solar cell body 31. The transparent conductive film layer 29 is formed of ITO, and the ITO films are formed by being superimposed on the solar cell body 31. The ITO films can be manufactured by using a chemical vapor deposition method or a physical vapor deposition method such as an evaporation method and a sputtering method.

Figure 7C:
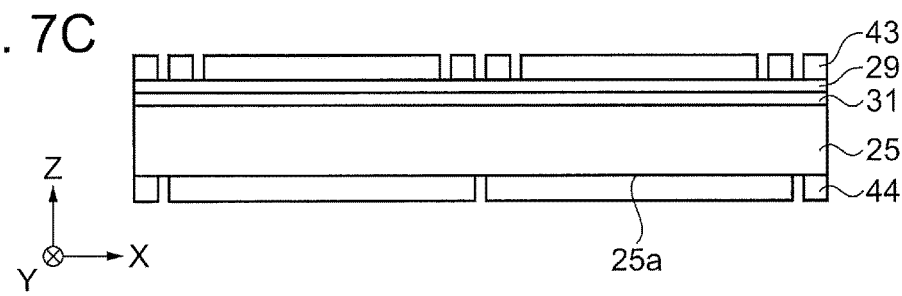
Figure 7D:
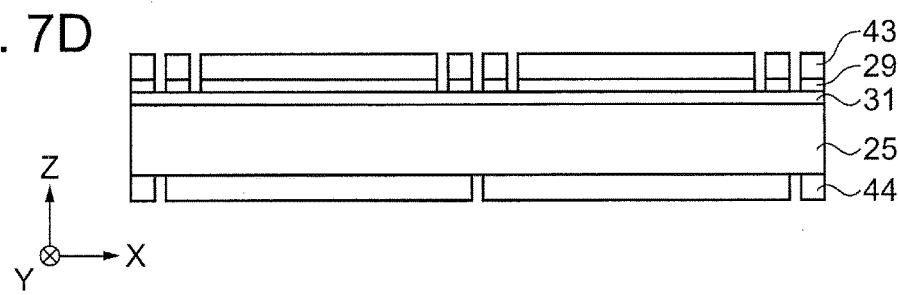

FIGS. 7C and 7D are views corresponding to the conductive film patterning step in Step S3. As illustrated in FIG. 7C, a front resist film 43 is installed on the transparent conductive film layer 29, and a rear resist film 44 is installed on a rear surface 25*a* of the support substrate 25. The rear surface 25*a* is a surface on the side where the substrate 24 is installed. The front resist film 43 and the rear resist film 44 are formed of the same resist material, and photosensitive resin materials can be used. The installation method of the front resist film 43 and the rear resist film 44 is not particularly limited. For example, in the embodiment, a dry film resist laminate is used for the front resist film 43 and the rear resist film 44, and is bonded to the support substrate 25. Next, both surfaces of the front resist film 43 and the rear resist film 44 are collectively exposed. In this manner, relative positions in the pattern of the front resist film 43 and the rear resist film 44 can be formed accurately. Next, the front resist film 43 and the rear resist film 44 are developed using a developing solution used for photosensitive resin.

As illustrated in FIG. 7D, the transparent conductive film layer 29 is then subjected to etching. When the transparent conductive film layer 29 is formed of ITO or IGO, the transparent conductive film layer 29 is subjected to the etching by using an oxalic acid-based etching solution.

Figure 7E:
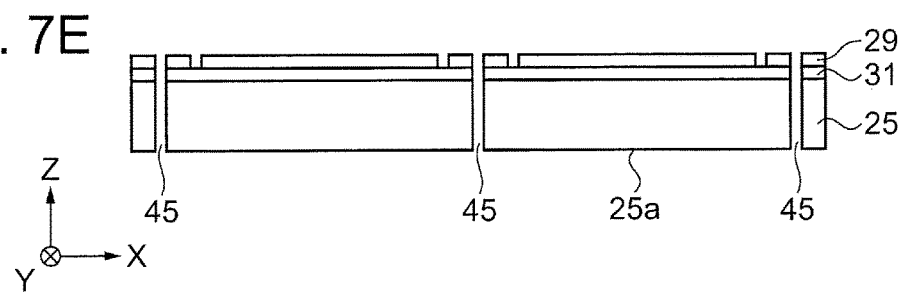

FIG. 7E is a view corresponding to the substrate etching step in Step 4. As illustrated in FIG. 7E, an etching solution is ejected onto the support substrate 25 through a nozzle on the rear surface 25*a* side of the support substrate 25. Since the material of the support substrate 25 is stainless steel, an aqueous solution of ferric chloride is used as the etching solution. The etching solution is ejected while the support substrate 25 is moved or swung in the direction X. In this manner, the etching solution can be evenly sprayed to the rear surface 25*a*.

The etching of the support substrate 25 is further progressively performed by using the etching solution. Since the solar cell body 31 is a thin film, the solar cell body 31 is broken and removed by hydraulic pressure of the etching solution. A through-hole 45 penetrating the transparent conductive film layer 29 and the rear surface 25*a* is formed therein.

Figure 8A:
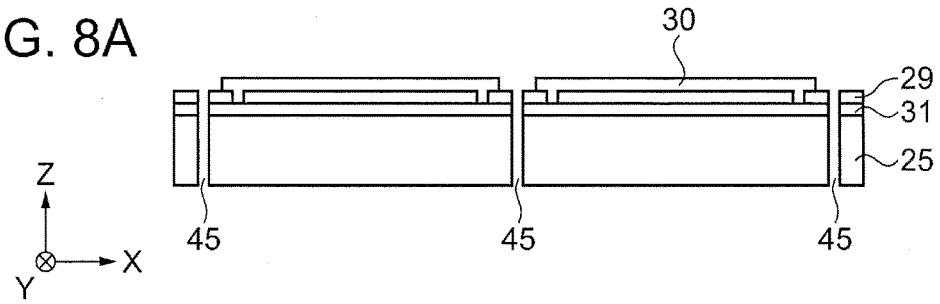
FIGS. 8A to 8D are schematic views for describing the manufacturing method of the solar cell.
Figure 8B:
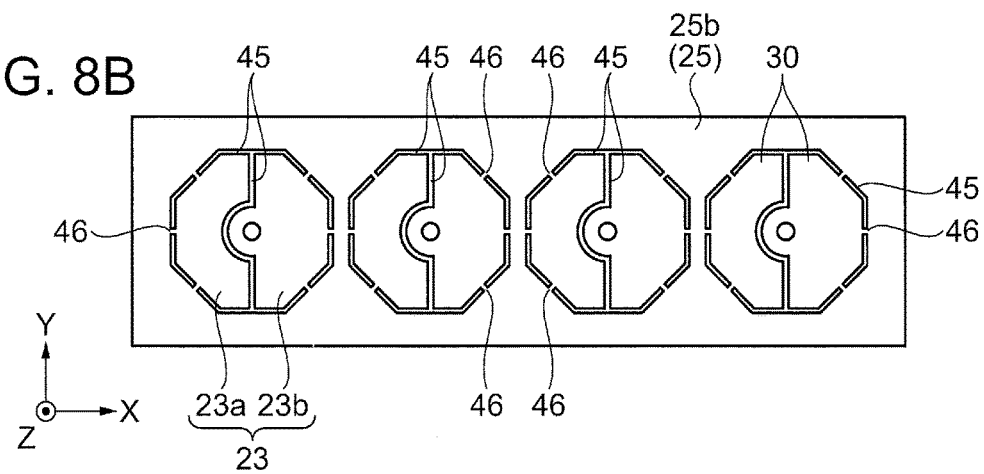

FIGS. 8A and 8B are views corresponding to the first insulating film installation step in Step S5. As illustrated in FIGS. 8A and 8B, in Step S5, the protective film layer 30 is installed on the transparent conductive film layer 29. The material of the protective film layer 30 can be installed using various printing methods, and the printing method is not particularly limited. For example, in the embodiment, the material of the protective film layer 30 is installed using a screen printing method. The material of the protective film layer 30 is heated, dried, and solidified. The heating temperature and the drying time are not particularly limited. However, in the embodiment, the heating temperature is approximately 150° C., for example, and the drying time is approximately 30 minutes.

As illustrated in FIG. 8B, an outer shape of the solar cell panel 23 is formed in the support substrate 25 by the through-hole 45. A frame body 25*b* of the support substrate 25 and the solar cell panel 23 are connected to each other by a connection portion 46.

Figure 8C:
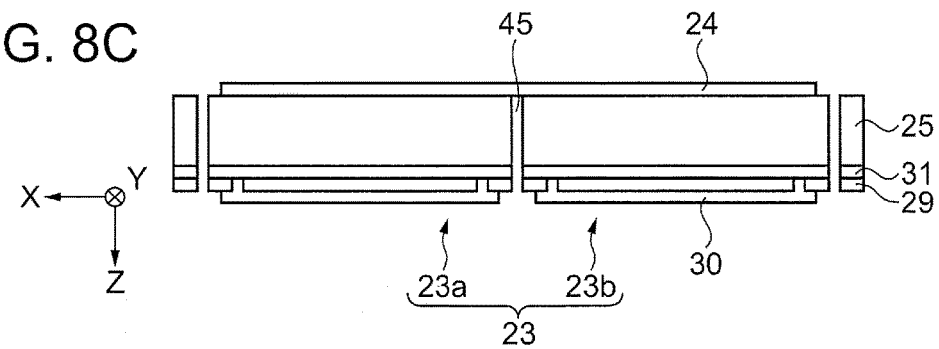
Figure 8D:
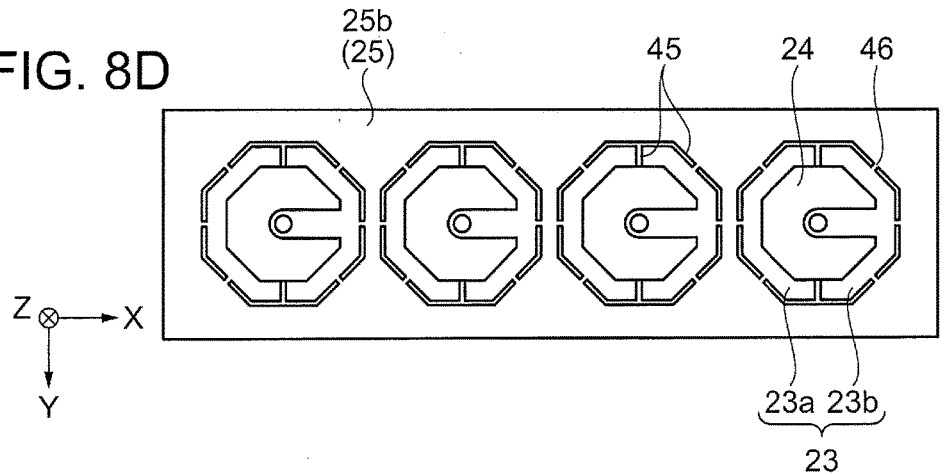

FIGS. 8C and 8D are views corresponding to the second insulating film installation step in Step S6. As illustrated in FIGS. 8C and 8D, in Step S6, the substrate 24 is installed on the rear surface 25*a* of the support substrate 25. The substrate 24 is installed across the first piece 23*a* and the second piece 23*b*.

The substrate 24 is a polyester film to which an adhesive is applied. The substrate 24 is placed on the support substrate 25 so that the surface having the adhesive applied thereto faces the support substrate 25. The substrate 24 and the support substrate 25 adhere to each other by pressing the substrate 24. The adhesive of the substrate 24 may be naturally dried or may be dried by heat.

Figure 9A:
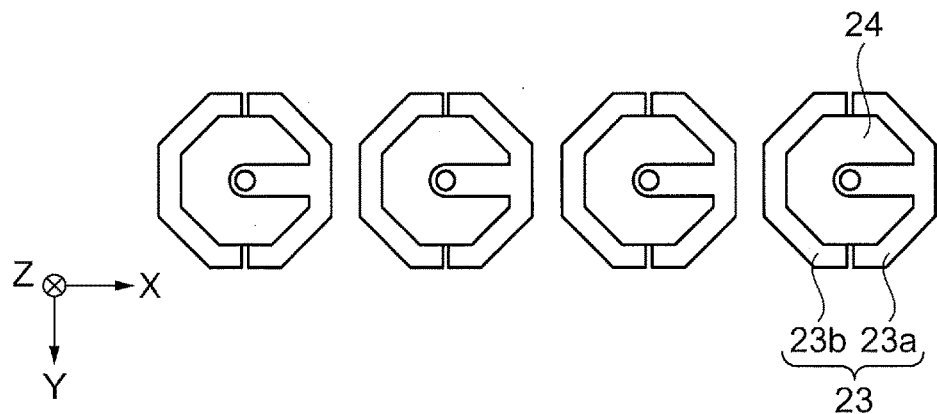
FIGS. 9A and 9B are schematic views for describing the manufacturing method of the solar cell.

FIG. 9A is a view corresponding to the piece producing step in Step S7. As illustrated in FIG. 9A, in Step S7, the connection portion 46 is cut so as to divide the solar cell panel 23 from the frame body 25*b*. The cutting method of the connection portion 46 is not particularly limited. However, the embodiment employs a vibration cutting machine, for example. The connection portion 46 can be easily cut due to metal fatigue caused by the vibration of the connection portion 46.

Figure 9B:
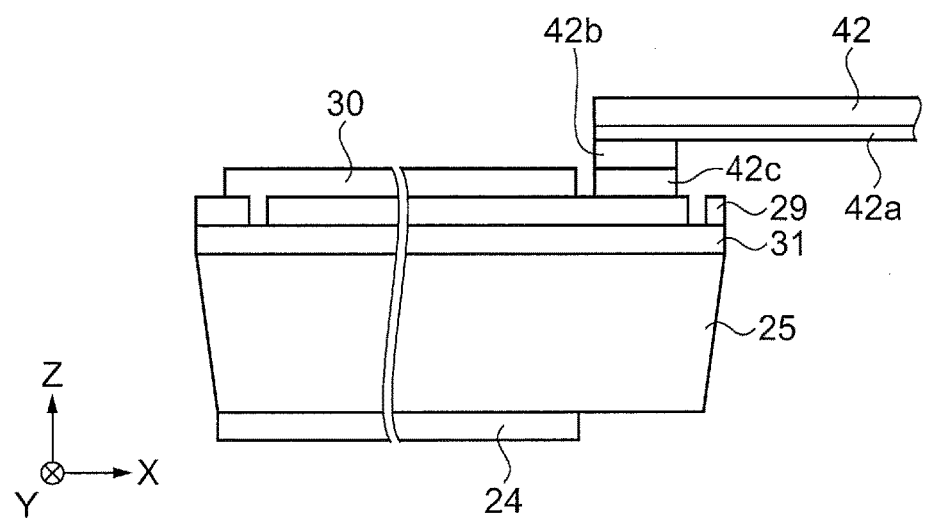

FIG. 9B is a view corresponding to the wiring member installation step in Step S8. As illustrated in FIG. 9B, in Step S8, the wiring member 42 is installed in the solar cell panel 23. First, an anisotrophic conductive film 42*b* adheres to a metal film 42*a* of the wiring member 42. For example, a conductive adhesive can be used for this adhesion.

Next, a conductive paste 42*c* is installed on the transparent conductive film layer 29. The anisotrophic conductive film 42*b* is superimposed on the conductive paste 42*c*. While the support substrate 25 and the wiring member 42 are pressed together, the anisotrophic conductive film 42*b* is heated. The anisotrophic conductive film 42*b* contains a thermosetting adhesive, and thus can cause the wiring member 42 to adhere to the solar cell panel 23. Through the above-described steps, the solar cell module 22 is completed.

As described above, according to the embodiment, the following advantageous effects are obtained.

(1) According to the embodiment, the solar cell panel 23 is configured to include the first piece 23*a* and the second piece 23*b*, and the pieces are connected to each other by the substrate 24. The first piece 23*a* and the second piece 23*b* are adjacent to each other. The shape of the respective sides where the first piece 23*a* and the second piece 23*b* oppose each other is the mutually fittable shape. The length of the mutually fittable shape is longer than the distance of the straight line which connects both ends of the mutually fittable shape. Therefore, the mutually fittable shape is not the straight line, and is an uneven shape. Accordingly, the substrate 24 which connects the respective pieces is prevented from being folded along a fold line of the straight line, and thus the solar cell panel 23 is less likely to be folded. Therefore, the pieces are prevented from being misaligned with each other due to the folded substrate 24. As a result, the solar cell module 22 has the solar cell panel 23 including the multiple pieces, and maintains a flat state. Therefore, it is possible to provide a module which is easily mounted on the timepiece 1.

(2) According to the embodiment, a portion of the first side 33 does not overlap the straight line 33*c*. In addition, a portion of the second side 34 does not overlap the straight line 34*c*. That is, at least a portion of the mutually fittable shape does not overlap the straight line which connects both ends of the mutually fittable shape. The portion which is not overlapped can prevent the solar cell module 22 from being folded along a fold line of the straight line which connects both ends of the mutually fittable shape.

(3) According to the embodiment, when the solar cell module 22 is planarly viewed from the solar cell panel 23 side, the area belonging to the substrate 23 is wider than the area belonging to the solar cell panel 24. When light is emitted to the solar cell module 22, light emitted to the solar cell panel 23 contributes to power generation, and light emitted to the substrate 24 does not contribute to power generation. The area of the solar cell panel 23 which contributes to the power generation is wider than the area of the substrate 24 which does not contribute to the power generation. Therefore, the solar cell module 22 can efficiently generate power.

(4) According to the embodiment, the through-hole 35 is installed in the solar cell panel 23. The surface height of the region 41 located within the predetermined distance from the through-hole 35 is uniform. Therefore, the hour hand 12 installed in the hour hand axle 21 installed in the through-hole 35 can utilize space on the region located within the predetermined distance from the through-hole 35.

(5) According to the embodiment, the solar cell module 22 includes the power generation layer 28 which generates power by receiving light. Furthermore, the solar cell module 22 includes the transparent conductive film layer 29 formed on the conductive support layer 25 and the power generation layer 28. Therefore, the power generated by the power generation layer 28 can be output from the support substrate 25 and the transparent conductive film layer 29.

(6) According to the embodiment, the first piece 23a and the second piece 23b are serially connected to each other. Therefore, the solar cell module 22 can output a voltage to which a voltage generated by each piece is added.

(7) According to the embodiment, the first piece 23a and the second piece 23b are serially connected to each other, and the power generation-available areas of the first piece 23a and the second piece 23b are the same as each other. In this case, the first piece 23a and the second piece 23b can output the same amount of current. When the power generation-available areas of the respective pieces in the solar cell panel 23 are different from each other, a current output from the narrowest power generation-available area is output from the solar cell module 22. As compared to this case, the solar cell module 22 according to the embodiment can more efficiently output the current.

(8) According to the embodiment, the timepiece 1 includes the dial 4 and the solar cell module 22. The solar cell module 22 is a module which is easily assembled to the timepiece 1 while maintaining a flat state. Therefore, the timepiece 1 according to the embodiment can function as the timepiece 1 including the solar cell module 22 which is easily assembled to timepiece 1.

(9) According to the embodiment, the through-hole 35 is provided in order to install the hour hand axle 21. Therefore, the hour hand 12 can also be installed in the timepiece 1 having the solar cell module 22 installed therein.

(10) According to the embodiment, the cut-out portion 24a is installed in the substrate 24. As the manufacturing method of the substrate 24, it is possible to select a method of punching a flexible and flat plate-shaped member, for example, into an outer shape of the substrate 24 by means of metal mold processing. In this case, if the through-hole instead of the cut-out such as the cut-out portion 24a is formed in the substrate 24, the member punched by means of the metal mold processing adheres to a metal mold, thereby causing the possibility that the metal mold may not last a long time.

In contrast, according to the embodiment, since the substrate 24 has a shape having the cut-out portion 24a formed therein, the punched member is less likely to adhere to the metal mold. Therefore, the metal mold can last a longer time.

(11) According to the embodiment, since the power generation layer 28 includes a layer formed of amorphous silicon germanium, it is possible to obtain a sufficient voltage, even when the solar cell panel 23 is divided into two pieces which are serially connected to each other.

Second Embodiment

Figure 10:
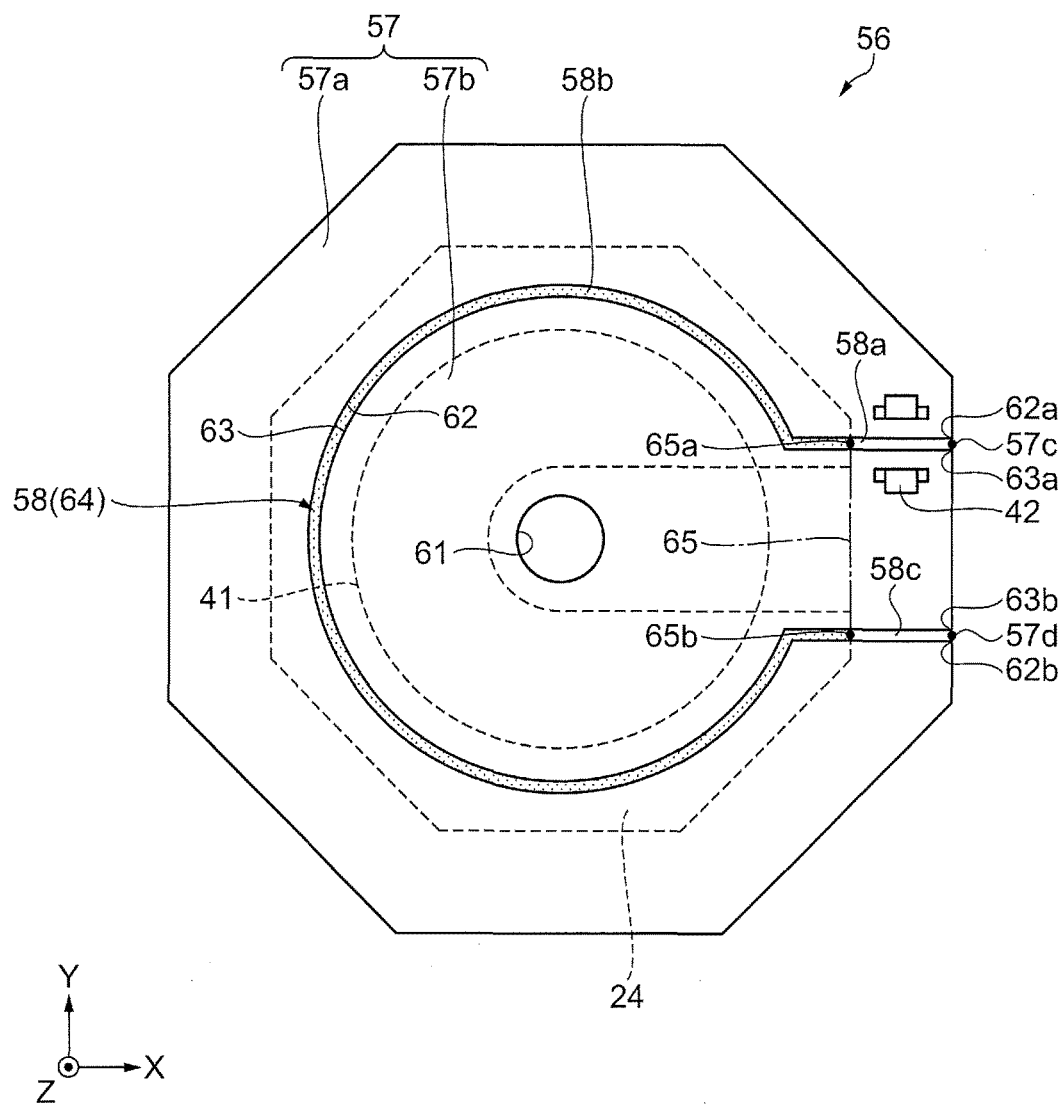
FIG. 10 is a schematic plan view illustrating a structure of a solar cell according to a second embodiment.

Next, an embodiment of the solar cell will be described with reference to FIG. 10. FIG. 10 is a schematic plan view illustrating a structure of the solar cell. The timepiece according to the embodiment includes the solar cell having the same structure as the structure of the solar cell in the first embodiment. The embodiment is different from the first embodiment in that a gap has a different shape from the gap 32 illustrated in FIG. 3. Description of the points which are the same as those in the first embodiment will be omitted.

That is, in the embodiment, as illustrated in FIG. 10, a solar cell module 56 includes a solar cell panel 57. The solar cell panel 57 is configured to include a first piece 57a serving as the first piece and a second piece 57b serving as the second piece. The first piece 57a has the same structure as that of the first piece 23a, and the second piece 57b has the same structure as that of the second piece 23b. In other words, the solar cell panel 57 is configured to include multiple pieces. The first piece 57a and the second piece 57b are connected to each other by the substrate 24. A linear gap 58 is installed between the first piece 57a and the second piece 57b. The first piece 57a and the second piece 57b are adjacent to each other while interposing the gap 58 therebetween.

The solar cell panel 57 has an octagonal planar shape, and a through-hole 61 is installed in the center of gravity. The gap 58 is arranged from a first outer shape point 57c located in the direction +X side and in the direction +Y side to a second outer shape point 57d located in the direction +X side and in the direction −Y side. The gap 58 has a first straight line portion 58a which extends from the first outer shape point 57c in the direction −X. Furthermore, the gap 58 has an arcuate portion 58b which is connected to the first straight line portion 58a and which is arranged concentrically with the through-hole 61. Furthermore, the gap 58 has a second straight line portion 58c which is connected to the arcuate portion 58b and which extends to the second outer shape point 57d in the direction +X.

A side on the gap 58 side in the first piece 57a is referred to as a first side 62 of sides. A side on the gap 58 side in the second piece 57b is referred to as a second side 63 of sides. The first side 62 and the second side 63 oppose each other, and the first side 62 and the second side 63 have a mutually fittable shape. An end close to the first outer shape point 57c in the first side 62 is referred to as a first side upper end 62a, and an end close to the second outer shape point 57d in the first side 62 is referred to as a first side lower end 62b. The length of a shape extending along the first side 62 is longer than a distance of a straight line which connects the first side upper end 62a and the first side lower end 62b. Similarly, an end close to the first outer shape point 57c in the second side 63 is referred to as a second side upper end 63a, and an end close to the second outer shape point 57d in the second side 63 is referred to as a second side lower end 63b. The length of a shape extending along the second side 63 is longer than a distance of a straight line which connects the second side upper end 63a and the second side lower end 63b.

When the solar cell panel 57 is planarly viewed in the direction Z, the first side 62 does not overlap the straight line which connects the first side upper end 62a and the first side lower end 62b. In addition, the second side 63 does not overlap the straight line which connects the second side upper end 63a and the second side lower end 63b. Since the gap 58 does not have a straight line shape, it is possible to prevent the solar cell panel 57 from being folded along a fold line of the gap 58.

A shape of the first side 62 and the second side 63 is not a straight line, and is an uneven shape. Accordingly, the substrate 24 which connects the first piece 57a and the second piece 57b is prevented from being folded along a fold line of the straight line, and thus the solar cell panel 57 is less likely to be folded. Therefore, the pieces are prevented from being misaligned with each other due to the folded substrate 24. As a result, the solar cell module 56 has the solar cell panel 57 including the multiple pieces, and maintains a flat state. Therefore, it is possible to provide a module which is easily assembled to the movement 13.

In an exposed region 64, the first side 62 and the second side 63 are longer than the length of a line segment 65 which connects an upper side end 65a and a lower side end 65b between the upper side end 65a and the lower side end 65b of the substrate 24. The first side 62 and the second side 63 do not overlap the line segment 65. Therefore, it is possible to prevent the solar cell panel 57 from being folded along a fold line of the line segment 65.

When planarly viewed in the direction Z side, an area obtained by adding the first piece 57a to the second piece 57b is wider than the exposed region 64 of the substrate 24. When light is emitted to the solar cell module 56, light emitted to the solar cell panel 57 contributes to power generation, but light emitted to the substrate 24 does not contribute to power generation. An area of the solar cell panel 57 which contributes to the power generation is wider than an area of the substrate 24 which does not contribute to the power generation. Accordingly, the solar cell module 56 can efficiently generate power.

In the region 41 which is away from the through-hole 61 at the equal distance, the solar cell module 56 has a uniform surface height. Therefore, the hour hand 12 installed via the hour hand axle 21 installed in the through-hole 61 can utilize space on the region 41.

The first piece 57a and the second piece 57b are serially connected to each other by the wiring member 42. Therefore, the solar cell module 56 can output a voltage to which a voltage generated by each piece is added. The power generation-available area of the first piece 57a and the power generation-available area of the second piece 57b are the same area. In this case, the first piece 57a and the second piece 57b can output the same amount of current. When the power generation-available areas of the first piece 57a and the second piece 57b are different from each other, a current output from the narrowest power generation-available area is output from the solar cell module 56. As compared to this case, the solar cell module 56 according to the embodiment can more efficiently output the current.

Third Embodiment

Figure 11:
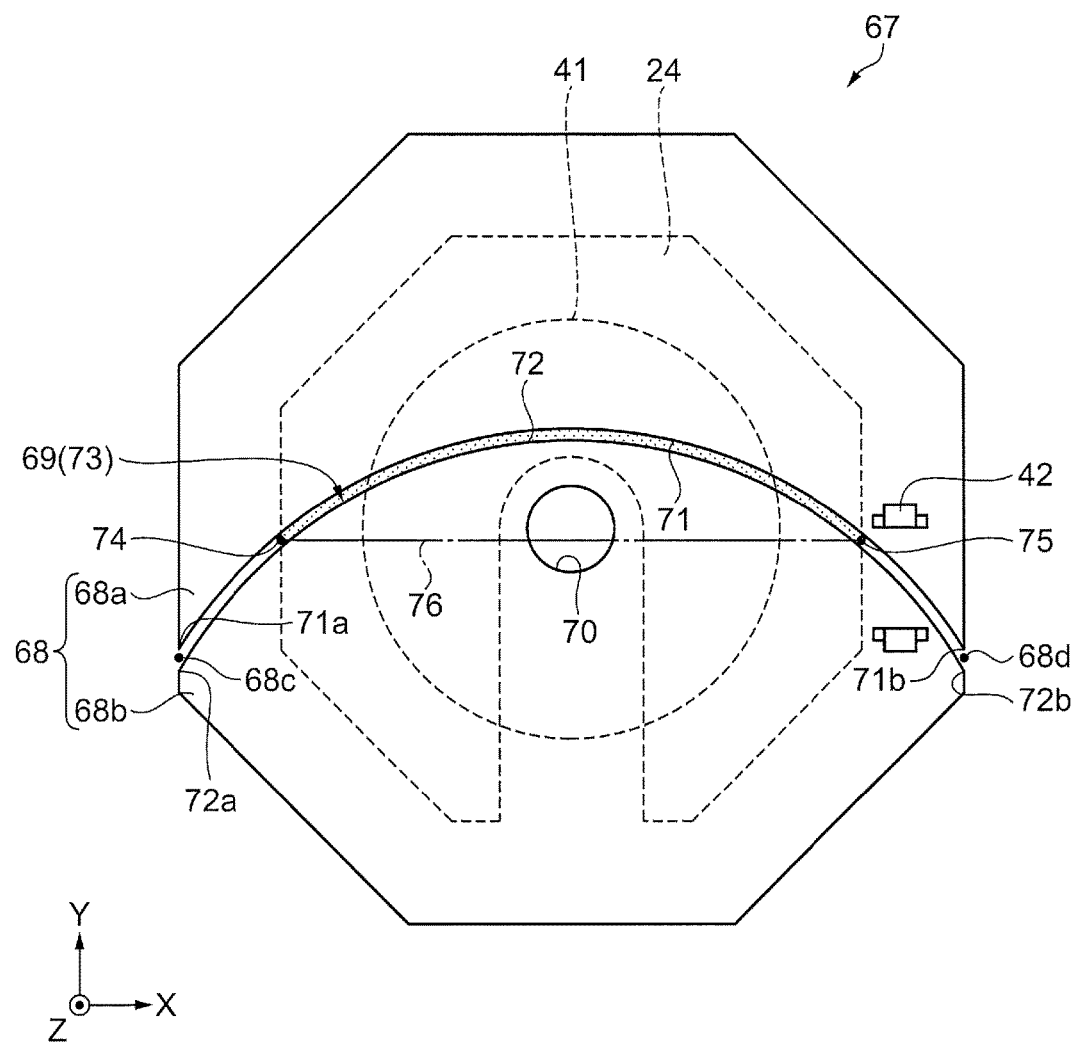
FIG. 11 is a schematic plan view illustrating a structure of a solar cell according to a third embodiment.

Next, an embodiment of the solar cell will be described with reference to FIG. 11. FIG. 11 is a schematic plan view illustrating a structure of the solar cell. The timepiece according to the embodiment includes the solar cell having the same structure as the structure of the solar cell in the first embodiment. The embodiment is different from the first embodiment in that a gap has a different shape from the gap 32 illustrated in FIG. 3. Description of the points which are the same as those in the first embodiment will be omitted.

That is, in the embodiment, as illustrated in FIG. 11, a solar cell module 67 includes a solar cell panel 68. The solar cell panel 68 is configured to include a first piece 68a serving as the first piece and a second piece 68b serving as the second piece. The first piece 68a has the same structure as that of the first piece 23a, and the second piece 68b has the same structure as that of the second piece 23b. In other words, the solar cell panel 68 is configured to include multiple pieces. The first piece 68a and the second piece 68b are connected to each other by the substrate 24. A linear gap 69 is installed between the first piece 68a and the second piece 68b. The first piece 68a and the second piece 68b are adjacent to each other while interposing the gap 69 therebetween.

The solar cell panel 68 has an octagonal planar shape, and a through-hole 70 is installed in the center of gravity. The gap 69 is arranged from a first outer shape point 68c located in the direction −X side to a second outer shape point 68d located in the direction +X side. A shape of the gap 69 is an arcuate shape extending from the first outer shape point 68c to the second outer shape point 68d.

A side on the gap 69 side in the first piece 68a is referred to as a first side 71 of sides. A side on the gap 69 side in the second piece 68b is referred to as a second side 72 of sides. The first side 71 and the second side 72 oppose each other, and the first side 71 and the second side 72 have a mutually fittable shape. An end close to the first outer shape point 68c in the first side 71 is referred to as a first side left end 71a, and an end close to the second outer shape point 68d in the first side 71 is referred to as a first side right end 71b. The length of a shape extending along the first side 71 is longer than a distance of a straight line which connects the first side left end 71a and the first side right end 71b. Similarly, an end close to the first outer shape point 68c in the second side 72 is referred to as a second side left end 72a, and an end close to the second outer shape point 68d in the second side 72 is referred to as a second side right end 72b. The length of a shape extending along the second side 72 is longer than a distance of a straight line which connects the second side left end 72a and the second side right end 72b.

When the solar cell panel 68 is planarly viewed in the direction Z, the first side 71 does not overlap the straight line which connects the first side left end 71a and the first side right end 71b. In addition, the second side 72 does not overlap the straight line which connects the second side left end 72a and the second side right end 72b. Since the gap 69 does not have a straight line shape, it is possible to prevent the solar cell panel 68 from being folded along a fold line of the gap 69.

A shape of the first side 71 and the second side 72 is not a straight line, and is an uneven shape. Accordingly, the substrate 24 which connects the first piece 68a and the second piece 68b is prevented from being folded along a fold line of the straight line, and thus the solar cell panel 68 is less likely to be folded. Therefore, the pieces are prevented from being misaligned with each other due to the folded substrate 24. As a result, the solar cell module 67 has the solar cell panel 68 including the multiple pieces, and maintains a flat state. Therefore, it is possible to provide a module which is easily assembled to the movement 13.

When planarly viewed in the direction Z side, an area obtained by adding the first piece 68a to the second piece 68b is wider than an exposed region 73 of the substrate 24. When light is emitted to the solar cell module 67, light emitted to the solar cell panel 68 contributes to power generation, but light emitted to the substrate 24 does not contribute to power generation. An area of the solar cell panel 68 which contributes to the power generation is wider than an area of the substrate 24 which does not contribute to the power generation. Accordingly, the solar cell module 67 can efficiently generate power.

In the exposed region 73, the first side 71 and the second side 72 are longer than the length of a line segment 76 which connects a left end 74 and a right end 75 between the left end 74 and the right end 75 of the substrate 24. The first side 71 and the second side 72 do not overlap the line segment 76. Therefore, it is possible to prevent the solar cell panel 68 from being folded along a fold line of the line segment 76.

In the region 41 which is away from the through-hole 70 at the equal distance, the solar cell module 67 has a uniform surface height. Therefore, the hour hand 12 installed via the hour hand axle 21 installed in the through-hole 70 can utilize space on the region 41.

The first piece 68a and the second piece 68b are serially connected to each other by the wiring member 42. Therefore, the solar cell module 67 can output a voltage to which a voltage generated by each piece is added. The power generation-available area of the first piece 68a and the power generation-available area of the second piece 68b are the same area. In this case, the first piece 68a and the second piece 68b can output the same amount of current. When the power generation-available areas of the first piece 68a and the second piece 68b are different from each other, a current output from the narrower power generation-available area is output from the solar cell module 67. As compared to this case, the solar cell module 67 according to the embodiment can more efficiently output the current.

Fourth Embodiment

Figure 12:
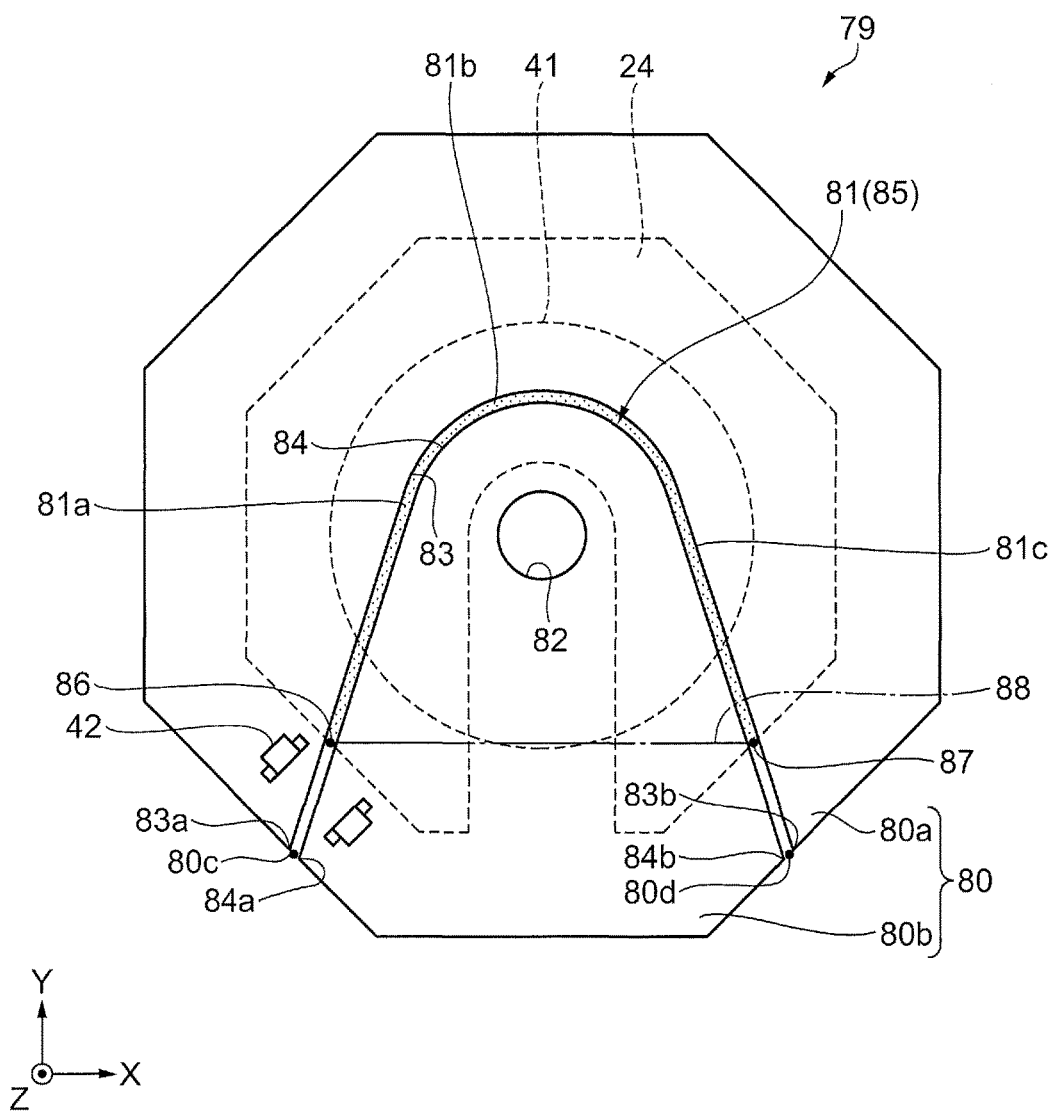
FIG. 12 is a schematic plan view illustrating a structure of a solar cell according to a fourth embodiment.

Next, an embodiment of the solar cell will be described with reference to FIG. 12. FIG. 12 is a schematic plan view illustrating a structure of the solar cell. The timepiece according to the embodiment includes the solar cell having the same structure as the first embodiment. The embodiment is different from the structure of the solar cell in the first embodiment in that a gap has a different shape from the gap 32 illustrated in FIG. 3. Description of the points which are the same as those in the first embodiment will be omitted.

That is, in the embodiment, as illustrated in FIG. 12, a solar cell module 79 includes a solar cell panel 80. The solar cell panel 80 is configured to include a first piece 80a serving as the first piece and a second piece 80b serving as the second piece. The first piece 80a has the same structure as that of the first piece 23a, and the second piece 80b has the same structure as that of the second piece 23b. In other words, the solar cell panel 80 is configured to include multiple pieces. The first piece 80a and the second piece 80b are connected to each other by the substrate 24. A linear gap 81 is installed between the first piece 80a and the second piece 80b. The first piece 80a and the second piece 80b are adjacent to each other while interposing the gap 81 therebetween.

The solar cell panel 80 has an octagonal planar shape, and a through-hole 82 is installed in the center of gravity. The gap 81 is arranged from a first outer shape point 80c located in the direction −X side to a second outer shape point 80d located in the direction +X side. The gap 81 has a shape in which a straight line portion 81a, an arcuate portion 81b, and a straight line portion 81 are arranged in this order from the first outer shape point 80c to the second outer shape point 80d.

A side on the gap 81 side in the first piece 80a is referred to as a first side 83 of sides. A side on the gap 81 side in the second piece 80b is referred to as a second side 84 of sides. The first side 83 and the second side 84 oppose each other, and the first side 83 and the second side 84 have a mutually fittable shape. An end close to the first outer shape point 80c in the first side 83 is referred to as a first side left end 83a, and an end close to the second outer shape point 80d in the first side 83 is referred to as a first side right end 83b. The length of a shape extending along the first side 83 is longer than a distance of a straight line which connects the first side left end 83a and the first side right end 83b. Similarly, an end close to the first outer shape point 80c in the second side 84 is referred to as a second side left end 84a, and an end close to the second outer shape point 80d in the second side 84 is referred to as a second side right end 84b. The length of a shape extending along the second side 84 is longer than a distance of a straight line which connects the second side left end 84a and the second side right end 84b.

When the solar cell panel 80 is planarly viewed in the direction Z, the first side 83 does not overlap the straight line which connects the first side left end 83a and the first side right end 83b. In addition, the second side 84 does not overlap the straight line which connects the second side left end 84a and the second side right end 84b. Since the gap 81 does not have a straight line shape, it is possible to prevent the solar cell panel 80 from being folded along a fold line of the gap 81.

A shape of the first side 83 and the second side 84 is not a straight line, and is an uneven shape. Accordingly, the substrate 24 which connects the first piece 80a and the second piece 80b is prevented from being folded along a fold line of the straight line, and thus the solar cell panel 80 is less likely to be folded. Therefore, the pieces are prevented from being misaligned with each other due to the folded substrate 24. As a result, the solar cell module 79 has the solar cell panel 80 including the multiple pieces, and maintains a flat state. Therefore, it is possible to provide a module which is easily assembled to the movement 13.

When planarly viewed in the direction Z side, an area obtained by adding the first piece 80a to the second piece 80b is wider than an exposed region 85 of the substrate 24. When light is emitted to the solar cell module 79, light emitted to the solar cell panel 80 contributes to power generation, but light emitted to the substrate 24 does not contribute to power generation. An area of the solar cell panel 80 which contributes to the power generation is wider than an area of the substrate 24 which does not contribute to the power generation. Accordingly, the solar cell module 79 can efficiently generate power.

In an exposed region 85, the first side 83 and the second side 84 are longer than the length of a line segment 88 which connects a left end 86 and a right end 87 between the left end 86 and the right end 87 of the substrate 24. The first side 83 and the second side 84 do not overlap the line segment 88. Therefore, it is possible to prevent the solar cell panel 80 from being folded along a fold line of the line segment 88.

In the region 41 which is away from the through-hole 82 at the equal distance, the solar cell module 79 has a uniform surface height. Therefore, the hour hand 12 installed via the hour hand axle 21 installed in the through-hole 82 can utilize space on the region 41.

The first piece 80a and the second piece 80b are serially connected to each other by the wiring member 42. Therefore, the solar cell module 79 can output a voltage to which a voltage generated by each piece is added. The power generation-available area of the first piece 80a and the power generation-available area of the second piece 80b are the same area. In this case, the first piece 80a and the second piece 80b can output the same amount of current. When the power generation-available areas of the first piece 80a and the second piece 80b are different from each other, a current output from the narrower power generation-available area is output from the solar cell module 79. As compared to this case, the solar cell module 79 according to the embodiment can more efficiently output the current.

Fifth Embodiment

Figure 13:
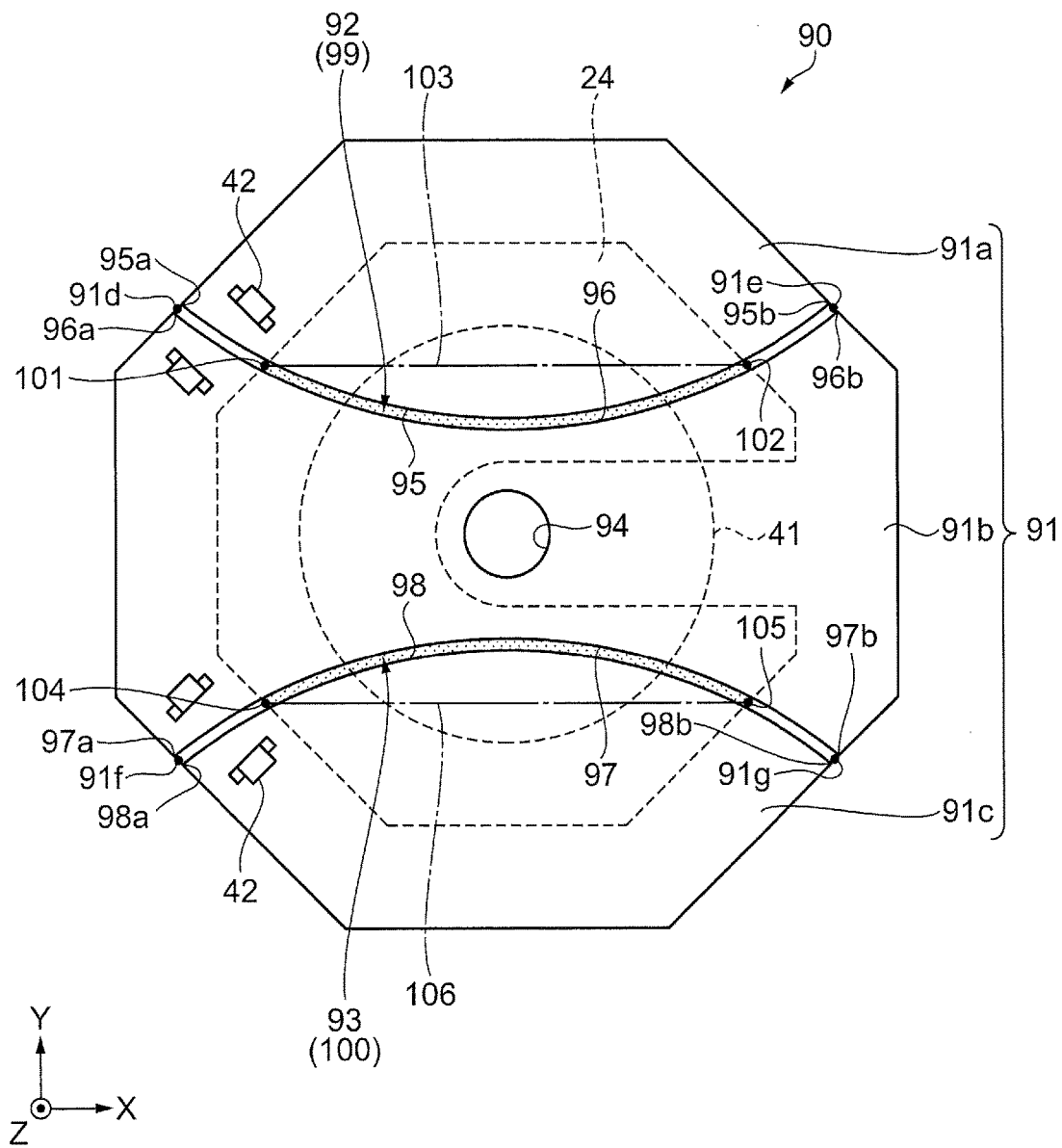
FIG. 13 is a schematic plan view illustrating a structure of a solar cell according to a fifth embodiment.

Next, an embodiment of the solar cell will be described with reference to FIG. 13. FIG. 13 is a schematic plan view illustrating a structure of the solar cell. The timepiece according to the embodiment includes the solar cell having the same structure as the first embodiment. The embodiment is different from the first embodiment in that there are provided three pieces, and in that a gap has a different shape from the gap 32 illustrated in FIG. 3. Description of the points which are the same as those in the first embodiment will be omitted.

That is, in the embodiment, as illustrated in FIG. 13, a solar cell module 90 includes a solar cell panel 91. The solar cell panel 91 is configured to include a first piece 91a serving as the first piece, and a second piece 91b and a third piece 91c which serve as the second piece. The first piece 91a has the same structure as the first piece 23a, and the second piece 91b has the same structure as the second piece 23b. The third piece 91c also has the same structure as the second piece 23b. In other words, the solar cell panel 91 is configured to include multiple pieces. The first piece 91a, the second piece 91b, and the third piece 91c are connected to one another by the substrate 24. A linear gap 92 is installed between the first piece 91a and the second piece 91b. The first piece 91a and the second piece 91b are adjacent to each other while interposing the gap 92 therebetween. A linear gap 93 is installed between the second piece 91b and the third piece 91c. The second piece 91b and the third piece 91c are adjacent to each other while interposing the gap 93 therebetween.

The solar cell panel 91 has an octagonal planar shape, and a through-hole 94 is installed in the center of gravity. The gap 92 is arranged from a first outer shape point 91d located in the direction −X side to a second outer shape point 91e located in the direction +X side. The gap 92 has an arcuate shape extending from the first outer shape point 91d to the second outer shape point 91e. Similarly, the gap 93 is arranged from a third outer shape point 91f located in the direction −X side to a fourth outer shape point 91g located in the direction +X side. The gap 93 has an arcuate shape extending from the third outer shape point 91f to the fourth outer shape point 91g.

A side on the gap 92 side in the first piece 91a is referred to as a first side 95 of sides. A side on the gap 92 side in the second piece 91b is referred to as a second side 96 of sides. The first side 95 and the second side 96 oppose each other, and the first side 95 and the second side 96 have a mutually fittable shape. An end close to the first outer shape point 91d in the first side 95 is referred to as a first side left end 95a, and an end close to the second outer shape point 91e in the first side 95 is referred to as a first side right end 95b. The length of a shape extending along the first side 95 is longer than a distance of a straight line which connects the first side left end 95a and the first side right end 95b. Similarly, an end close to the first outer shape point 91d in the second side 96 is referred to as a second side left end 96a, and an end close to the second outer shape point 91e in the second side 96 is referred to as a second side right end 96b. The length of a shape extending along the second side 96 is longer than a distance of a straight line which connects the second side left end 96a and the second side right end 96b.

Similarly, a side on the gap 93 side in the second piece 91b is referred to as a third side 97 of sides. A side on the gap 93 side in the third piece 91c is referred to as a fourth side 98 of sides. The third side 97 and the fourth side 98 oppose each other, and the third side 97 and the fourth side 98 have a mutually fittable shape. An end close to the third outer shape point 91f in the third side 97 is referred to as a third side left end 97a, and an end close to the fourth outer shape point 91g in the third side 97 is referred to as a third side right end 97b. The length of a shape extending along the third side 97 is longer than a distance of a straight line which connects the third side left end 97a and the third side right end 97b. Similarly, an end close to the third outer shape point 91f in the fourth side 98 is referred to as a fourth side left end 98a, and an end close to the fourth outer shape point 91g in the fourth side 98 is referred to as a fourth side right end 98b. The length of a shape extending along the fourth side 98 is longer than a distance of a straight line which connects the fourth side left end 98a and the fourth side right end 98b.

When the solar cell panel 91 is planarly viewed in the direction Z, the first side 95 does not overlap the straight line which connects the first side left end 95a and the first side right end 95b. In addition, the second side 96 does not overlap the straight line which connects the second side left end 96a and the second side right end 96b. Since the gap 92 is not caused to have a straight line shape, it is possible to prevent the solar cell panel 91 from being folded along a fold line of the gap 92. Similarly, the third side 97 does not overlap the straight line which connects the third side left end 97a and the third side right end 97b. In addition, the fourth side 98 does not overlap the straight line which connects the fourth side left end 98a and the fourth side right end 98b. Since the gap 93 is not caused to have a straight line shape, it is possible to prevent the solar cell panel 91 from being folded along a fold line of the gap 93.

A shape of the first side 95 and the second side 96 is not a straight line, and is an uneven shape. Accordingly, the substrate 24 which connects the first piece 91a and the second piece 91b is prevented from being folded along a fold line of the straight line, and thus the solar cell panel 91 is less likely to be folded. Similarly, a shape of the third side 97 and the fourth side 98 is not a straight line, and is an uneven shape. Accordingly, the substrate 24 which connects the second piece 91b and the third piece 91c is prevented from being folded along a fold line of the straight line, and thus the solar cell panel 91 is less likely to be folded. Therefore, the pieces are prevented from being misaligned with each other due to the folded substrate 24. As a result, the solar cell module 90 has the solar cell panel 91 including the multiple pieces, and maintains a flat state. Therefore, it is possible to provide a module which is easily assembled to the movement 13.

When planarly viewed in the direction Z side, an area obtained by adding the first piece 91a to the second piece 91b and the third piece 91c is wider than a region obtained by adding an exposed region 99 to an exposed region 100 of the substrate 24. When light is emitted to the solar cell module 90, light emitted to the solar cell panel 91 contributes to power generation, but light emitted to the substrate 24 does not contribute to power generation. An area of the solar cell panel 91 which contributes to the power generation is wider than an area of the substrate 24 which does not contribute to the power generation. Accordingly, the solar cell module 90 can efficiently generate power.

In the exposed region 99, the first side 95 and the second side 96 are longer than the length of a line segment 103 which connects a left end 101 and a right end 102 between the left end 101 and the right end 102 of the substrate 24. The first side 95 and the second side 96 do not overlap the line segment 103. Therefore, it is possible to prevent the solar cell panel 91 from being folded along a fold line of the line segment 103. Similarly, in the exposed region 100, the third side 97 and the fourth side 98 are longer than the length of a line segment 106 which connects a left end 104 and a right end 105 between the left end 104 and the right end 105 of the substrate 24. The third side 97 and the fourth side 98 do not overlap the line segment 106. Therefore, it is possible to prevent the solar cell panel 91 from being folded along a fold line of the line segment 106.

In the region 41 which is away from the through-hole 94 at the equal distance, the solar cell module 90 has a uniform surface height. Therefore, the hour hand 12 installed via the hour hand axle 21 installed in the through-hole 94 can utilize space on the region 41.

The first piece 91a, the second piece 91b, and the third piece 91c are serially connected to one another by the wiring member 42. Therefore, the solar cell module 90 can output a voltage to which a voltage generated by each piece is added. The power generation-available area of the first piece 91a and the power generation-available areas of the second piece 91b and the third piece 91c are the same area. In this case, the first piece 91a, the second piece 91b, and the third piece 91c can output the same amount of current. When the power generation-available areas of the first piece 91a, the second piece 91b, and the third piece 91c are different from one another, a current output from the narrowest power generation-available area is output from the solar cell module 90. As compared to this case, the solar cell module 90 according to the embodiment can more efficiently output the current.

In the solar cell panel 91, three pieces are serially connected to one another. Therefore, a value of a voltage which can be generated by the solar cell panel 91 can be greater than when the number of pieces is one or two.

Sixth Embodiment

Figure 14:
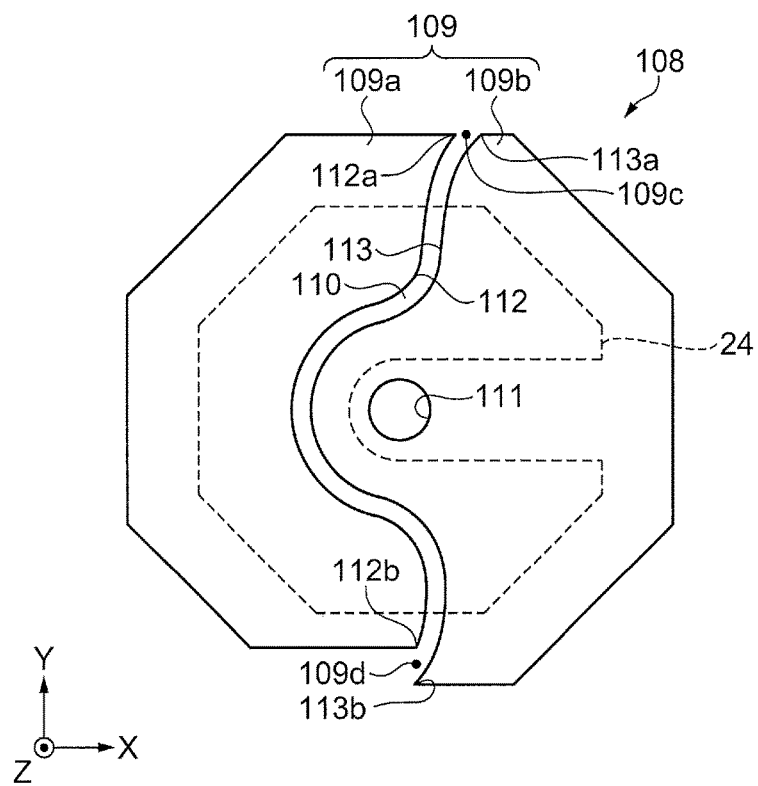
FIG. 14 is a schematic plan view illustrating a structure of a solar cell according to a sixth embodiment.

Next, an embodiment of the solar cell will be described with reference to FIG. 14. FIG. 14 is a schematic plan view illustrating a structure of the solar cell. The timepiece according to the embodiment includes the solar cell having the same structure as the first embodiment. The embodiment is different from the first embodiment in that a gap has a different shape from the gap 32 illustrated in FIG. 3. Description of the points which are the same as those in the first embodiment will be omitted.

That is, in the embodiment, as illustrated in FIG. 14, a solar cell module 108 includes a solar cell panel 109. The solar cell panel 109 is configured to include a first piece 109a serving as the first piece and a second piece 109b serving as the second piece. The first piece 109a has the same structure as the first piece 23a, and the second piece 109b has the same structure as the second piece 23b. In other words, the solar cell panel 109 is configured to include multiple pieces. The first piece 109a and the second piece 109b are connected to each other by the substrate 24. A linear gap 110 is installed between the first piece 109a and the second piece 109b. The first piece 109a and the second piece 109b are adjacent to each other while interposing the gap 110 therebetween.

The solar cell panel 109 has an octagonal planar shape, and a through-hole 111 is installed in the center of gravity. The gap 110 is arranged from a first outer shape point 109c located in the direction +Y side to a second outer shape point 109d located in the direction −Y side. The gap 110 is configured to have multiple arcuate shapes extending from the first outer shape point 109c to the second outer shape point 109d.

A side on the gap 110 side in the first piece 109a is referred to as a first side 112 of sides. A side on the gap 110 side in the second piece 109b is referred to as a second side 113 of sides. The first side 112 and the second side 113 oppose each other, and the portions of the first side 112 and the second side 113 have a mutually fittable shape. The second side 113 is longer than the first side 112. Accordingly, a portion of the second side 113 does not oppose the first side 112 at a location close to the second outer shape point 109d. An end close to the first outer shape point 109c in the first side 112 is referred to as a first side upper end 112a, and an end close to the second outer shape point 109d in the first side 112 is referred to as a first side lower end 112b. The length of a shape extending along the first side 112 is longer than a distance of a straight line which connects the first side upper end 112a and the first side lower end 112b. Similarly, an end close to the first outer shape point 109c in the second side 113 is referred to as a second side upper end 113a, and an end close to the second outer shape point 109d in the second side 113 is referred to as a second side lower end 113b. The length of a shape extending along the second side 113 is longer than a distance of a straight line which connects the second side upper end 113a and the second side lower end 113b.

When the solar cell panel 109 is planarly viewed in the direction Z, the first side 112 does not overlap the straight line which connects the first side upper end 112a and the first side lower end 112b. In addition, the second side 113 does not overlap the straight line which connects the second side upper end 113a and the second side lower end 113b. Even when the first side 112 and the second side 113 have different lengths in this way, since the gap 110 does not have a straight line shape, it is possible to prevent the solar cell panel 109 from being folded along a fold line of the gap 110.

A shape of the first side 112 and the second side 113 is not a straight line, and is an uneven shape. Accordingly, the substrate 24 which connects the first piece 109a and the second piece 109b is prevented from being folded along a fold line of the straight line, and thus the solar cell panel 109 is less likely to be folded. Therefore, the pieces are prevented from being misaligned with each other due to the folded substrate 24. As a result, the solar cell module 108 has the solar cell panel 109 including the multiple pieces, and maintains a flat state. Therefore, it is possible to provide a module which is easily assembled to the movement 13.

Seventh Embodiment

Figure 15:
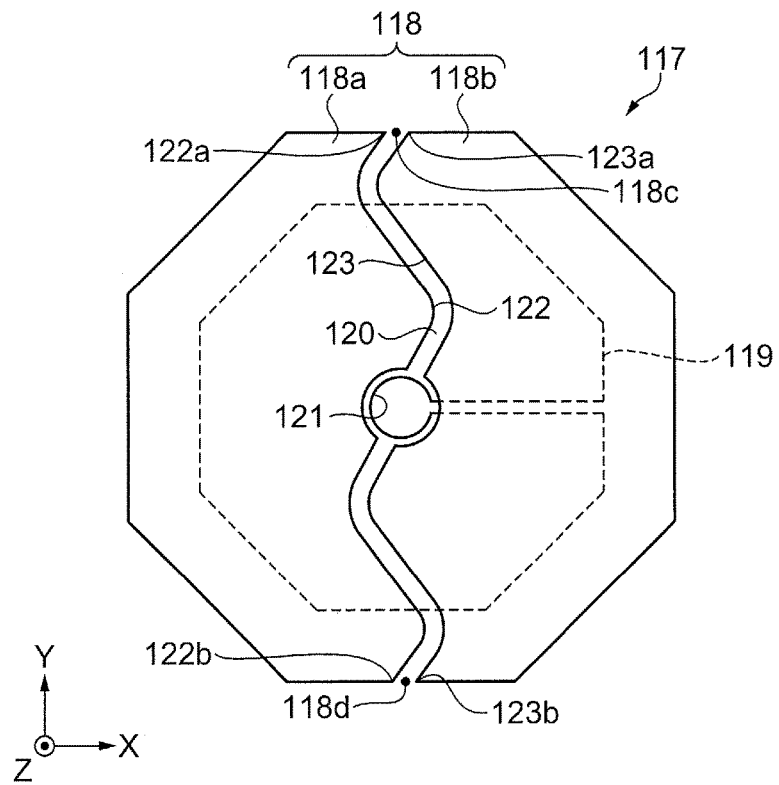
FIG. 15 is a schematic plan view illustrating a structure of a solar cell according to a seventh embodiment.

Next, an embodiment of the solar cell will be described with reference to FIG. 15. FIG. 15 is a schematic plan view illustrating a structure of the solar cell. The timepiece according to the embodiment includes the solar cell having the same structure as the first embodiment. The embodiment is different from the first embodiment in that a gap has a different shape from the gap 32 illustrated in FIG. 3. Description of the points which are the same as those in the first embodiment will be omitted.

That is, in the embodiment, as illustrated in FIG. 15, a solar cell module 117 includes a solar cell panel 118. The solar cell panel 118 is configured to include a first piece 118a serving as the first piece and a second piece 118b serving as the second piece. The first piece 118a has the same structure as the first piece 23a, and the second piece 118b has the same structure as the second piece 23b. In other words, the solar cell panel 118 is configured to include multiple pieces. The first piece 118a and the second piece 118b are connected to each other by a substrate 119. A linear gap 120 is installed between the first piece 118a and the second piece 118b. The first piece 118a and the second piece 118b are adjacent to each other while interposing the gap 120 therebetween.

The solar cell panel 118 has an octagonal planar shape, and a gap 120 is installed in the center of gravity. A through-hole 121 is installed at a location opposing the center of gravity of the solar cell panel 118 in the substrate 119. The gap 120 is arranged from a first outer shape point 118c located in the direction +Y side to a second outer shape point 118d located in the direction −Y side. The gap 120 is configured to have multiple arcuate shapes extending from the first outer shape point 118c to the second outer shape point 118d.

A side on the gap 120 side in the first piece 118a is referred to as a first side 122 of sides. A side on the gap 120 side in the second piece 118b is referred to as a second side 123 of sides. The first side 122 and the second side 123 oppose each other, and the first side 122 and the second side 123 have a mutually fittable shape. An end close to the first outer shape point 118c in the first side 122 is referred to as a first side upper end 122a, and an end close to the second outer shape point 118d in the first side 122 is referred to as a first side lower end 122b. The length of a shape extending along the first side 122 is longer than a distance of a straight line which connects the first side upper end 122a and the first side lower end 122b. Similarly, an end close to the first outer shape point 118c in the second side 123 is referred to as a second side upper end 123a, and an end close to the second outer shape point 118d in the second side 123 is referred to as a second side lower end 123b. The length of a shape extending along the second side 123 is longer than a distance of a straight line which connects the second side upper end 123a and the second side lower end 123b.

When the solar cell panel 118 is planarly viewed in the direction Z, the first side 122 does not overlap the straight line which connects the first side upper end 122a and the first side lower end 122b. In addition, the second side 123 does not overlap the straight line which connects the second side upper end 123a and the second side lower end 123b. Since the gap 120 does not have a straight line shape in this way, it is possible to prevent the solar cell panel 118 from being folded along a fold line of the gap 120.

A shape of the first side 122 and the second side 123 is not a straight line, and is an uneven shape. Accordingly, the substrate 119 which connects the first piece 118a and the second piece 118b is prevented from being folded along a fold line of the straight line, and thus the solar cell panel 118 is less likely to be folded. Therefore, the pieces are prevented from being misaligned with each other due to the folded substrate 119. As a result, the solar cell module 117 has the solar cell panel 118 including the multiple pieces, and maintains a flat state. Therefore, it is possible to provide a module which is easily assembled to the movement 13.

A through-hole 121 is installed in the substrate 119. The solar cell panel 118 has no through-hole, and the hour hand axle 21 is installed in the gap 120. As compared to the substrate 119, the solar cell panel 118 is manufactured through more work processes. In this case, the solar cell panel 118 can be more easily manufactured when the through-hole is absent than when the through-hole is present. Therefore, it is possible to manufacture the solar cell panel 118 by installing the through-hole 121 in the substrate 119.

The embodiment is not limited to the above-described embodiments, and can be modified or improved in various ways within the technical spirit of the invention by those skilled in the art. Modification examples will be described as follows.

Modification Example 1

In the first embodiment, the solar cell panel 23 is configured to include two pieces. In addition, in the fifth embodiment, the solar cell panel 91 is configured to include three pieces. The solar cell panel may be configured to include four or more pieces. Even in this case, a gap is caused to have a shape which is longer than a straight line which connects both ends, thereby enabling the solar cell panel to be less likely to be folded.

Modification Example 2

In the first embodiment, the gap 32 has a shape including a straight line and a curve. The gap 32 may be configured to include only the straight line. Even in this case, a gap is caused to have a shape which is longer than a straight line which connects both ends, thereby enabling the solar cell panel to be less likely to be folded.

Modification Example 3

In the first embodiment, the respective areas of the first piece 23a and the second piece 23b are the same as each other. When light-emitted degrees thereof are different from each other, the respective areas of the first piece 23a and the second piece 23b may be differently changed. The respective areas may be set in view of power generation efficiency.

Modification Example 4

In the first embodiment, the power generation layer 28 is configured so that the first amorphous silicon germanium layer 28a, the second amorphous silicon germanium layer 28b, and the amorphous silicon layer 28c are stacked thereon. The configuration of the power generation layer 28 is not particularly limited as long as the configuration is within a range where a required voltage can be obtained. For example, the power generation layer 28 may be configured to include only one layer of the amorphous silicon germanium layer. In addition, without being limited to the above-described configuration, as the configuration of the power generation layer 28, any desired configuration may be selected from configurations used as the solar cell.

Modification Example 5

In the first embodiment, the through-hole 35 is installed in the solar cell panel 23, and the cut-out portion 24a is installed in the substrate 24. The hour hand axle 21 is installed through the cut-out portion 24a and the through-hole 35. Instead of the cut-out portion 24a, a through-hole may be installed in the substrate 24. Similarly, in the seventh embodiment, the through-hole 121 is installed in the substrate 119. The through-hole 121 is connected to the outer shape. The through-hole 121 may be a hole which is not connected to the outer shape.

Modification Example 6

In the first embodiment to the seventh embodiment, a case has been described in which the electronic device having the solar cell module mounted thereon is the wrist watch, but the embodiments are not limited thereto. The electronic device having the solar cell module mounted thereon may be a mobile terminal or the like, for example. In addition, the solar cell module may be installed in devices which are installed in a light-emitted place such as gas meters and water meters, or portable devices such as electrical testers and static measurement instruments. Even in this case, the solar cell panel is less likely to be bent. Therefore, it is possible to easily assemble the devices.

What is claimed is:

1. A solar cell module configured to include multiple solar cell panels, comprising:
    a first solar cell panel;
    a second solar cell panel;
    a non-conductive substrate that connects the first solar cell panel and the second solar cell panel to each other; and
    a wiring member that electrically connects the first solar cell panel and the second solar cell panel to each other,
    wherein opposing sides of the first solar cell panel and the second solar cell panel respectively have a mutually fittable shape that includes an uneven shape to prevent the first and second solar cell panels from being folded along a straight fold line,
    wherein a portion of one of the first solar panel and the second solar panel that includes the uneven shape prevents the non-conductive substrate from being folded along the straight fold line by resisting a folding force,
    wherein a gap is provided between the first solar cell panel and the second solar cell panel that extends along a first direction intersecting the straight fold line and a second direction along the straight fold line,
    wherein the wiring member is arranged outside the non-conductive substrate; and wherein the first solar cell panel and the second solar cell panel combine to define a circle.

2. The solar cell module according to claim 1,
    wherein a length of the mutually fittable shape is longer than a distance of a straight line which connects both ends of the mutually fittable shape.

3. A timepiece comprising:
    a dial; and
    the solar cell module according to claim 2.

4. An electronic device comprising:
    the solar cell module according to claim.

5. The solar cell module according to claim 1,
    wherein in a state where the solar cell module is planarly viewed, at least a portion of the mutually fittable shape does not overlap a straight line which connects both ends of the mutually fittable shape.

6. A timepiece comprising:
    a dial; and
    the solar cell module according to claim 5.

7. An electronic device comprising:
    the solar cell module according to claim 5.

8. The solar cell module according to claim 1,
    wherein the first solar cell panel and the second solar cell panel leave a predetermined gap therebetween, and are connected to each other on a rear surface side of the solar cell module by the non-conductive substrate, and
    wherein when the solar cell module is planarly viewed from a front surface side, if an area belonging to the first solar cell panel and the second solar cell panel is compared with an area belonging to the non-conductive substrate, the area belonging to the non-conductive substrate is narrower.

9. A timepiece comprising:
    a dial; and
    the solar cell module according to claim 8.

10. An electronic device comprising:
    the solar cell module according to claim 8.

11. The solar cell module according to claim 1,
    wherein at least any one of the first solar cell panel, the second solar cell panel, and the non-conductive substrate has a through-hole, and
    wherein a surface height of a region located within a predetermined distance from the through-hole in the solar cell module is uniform.

12. The solar cell module according to claim 11,
    wherein the through-hole is disposed in the non-conductive substrate.

13. A timepiece comprising:
    a dial; and
    the solar cell module according to claim 11.

14. A timepiece comprising:
    the solar cell module according to claim 11,
    wherein the through-hole is provided in order to install a hand of the timepiece.

15. The solar cell module according to claim 1,
    wherein the first solar cell panel and the second solar cell panel respectively have a conductive support substrate, a power generation layer which generates power by receiving light, and a transparent conductive film layer which is formed on the power generation layer.

16. The solar cell module according to claim 1,
    wherein the first solar cell panel and the second solar cell panel are electrically and serially connected to each other.

17. The solar cell module according to claim 1,
    wherein respective power generation-available areas of the first solar cell panel and the second solar cell panel are the same as each other.

18. A timepiece comprising:
    a dial; and
    the solar cell module according to claim 1.

19. The timepiece according to claim 18,
    wherein in a state of being viewed from the solar cell panel side, an area of the solar cell module is equal to or smaller than an area of the dial.

20. An electronic device comprising:
    the solar cell module according to claim 1.

21. The solar cell module according to claim 1,
    wherein a cut-out portion of the wiring member that extends along the second direction intersects the first direction.

22. The solar cell module according to claim 1,
    wherein the gap includes an arcuate portion.

* * * * *